US012238904B2

United States Patent
Kosteva et al.

(10) Patent No.: US 12,238,904 B2
(45) Date of Patent: Feb. 25, 2025

(54) COOLING SYSTEM WITH COMMON MODULAR MANIFOLDS

(71) Applicant: BAE Systems Controls Inc., Endicott, NY (US)

(72) Inventors: Stephen J. Kosteva, Endicott, NY (US); Cameron R. Vakili, Binghamton, NY (US); Leslie R. Baker, Binghamton, NY (US); Stephen L. Homan, Endicott, NY (US)

(73) Assignee: BAE Systems Controls Inc., Endicott, NY (US)

( * ) Notice: Subject to any disclaimer, the term of this patent is extended or adjusted under 35 U.S.C. 154(b) by 83 days.

(21) Appl. No.: 18/067,025

(22) Filed: Dec. 16, 2022

(65) Prior Publication Data

US 2024/0206135 A1 Jun. 20, 2024

(51) Int. Cl.
*H05K 7/20* (2006.01)
*H02M 7/00* (2006.01)

(52) U.S. Cl.
CPC ........ *H05K 7/20927* (2013.01); *H02M 7/003* (2013.01); *H05K 7/20272* (2013.01); *H05K 7/20436* (2013.01)

(58) Field of Classification Search
None
See application file for complete search history.

(56) References Cited

U.S. PATENT DOCUMENTS 7,011,143 B2  3/2006  Corrado et al.
7,255,153 B2  8/2007  Berger et al.
8,584,457 B2  11/2013  Kardos et al.
8,755,179 B2  6/2014  Alyaser et al.
8,895,173 B2 * 11/2014  Gandhi ................... B60L 50/66
                                                    429/120
9,743,562 B2  8/2017  Desiano et al.
9,861,012 B2  1/2018  Krug, Jr. et al.
(Continued)

FOREIGN PATENT DOCUMENTS

JP          5596855 B2       9/2014

OTHER PUBLICATIONS

International Search Report, PCT/US23/82445, mailed Mar. 18, 2024, 7 pages.

*Primary Examiner* — Courtney L Smith
(74) *Attorney, Agent, or Firm* — Scully Scott Murphy & Presser PC; Gary McFaline

(57) ABSTRACT

A cooling system for a modular power control system (MPCS) is provided. The MPCS comprises modules. Each module has a chassis with a first manifold segment for first common manifold and a second manifold segment for second common manifold. When the modules are mounts to each other, the first manifold segments align to form the first common manifold and the second manifold segments align to form the second common manifold, providing two fluid channels between endcaps. The chassis of at least two modules further have a first opening providing a fluid interface region between the first common manifold and a module specific flow path, and a second opening providing a fluid interface region between the module specific flow path and the second common manifold. The module specific flow path provides at least one fluid branch between the first common manifold and the second common manifold.

19 Claims, 22 Drawing Sheets

(56) References Cited

U.S. PATENT DOCUMENTS

| | | | |
|---|---|---|---|
| 10,405,466 B1* | 9/2019 | Pradeepkumar | H01L 23/4006 |
| 11,183,901 B2 | 11/2021 | Zhou et al. | |
| 2004/0037045 A1 | 2/2004 | Phillips | |
| 2005/0173097 A1 | 8/2005 | Kitajima et al. | |
| 2006/0174642 A1* | 8/2006 | Nagashima | F28D 15/0266 |
| | | | 62/119 |
| 2012/0212907 A1* | 8/2012 | Dede | H01L 23/4735 |
| | | | 361/689 |
| 2013/0335920 A1* | 12/2013 | Murata | H01L 25/112 |
| | | | 361/699 |
| 2014/0126151 A1 | 5/2014 | Campbell et al. | |
| 2015/0348869 A1* | 12/2015 | Joshi | H01L 25/07 |
| | | | 165/104.31 |
| 2022/0069384 A1* | 3/2022 | Choi | H01M 10/6567 |
| 2022/0190736 A1 | 6/2022 | Schmidt et al. | |
| 2023/0086299 A1* | 3/2023 | Arya | H01M 8/04029 |
| | | | 165/41 |
| 2023/0318118 A1* | 10/2023 | Hickey | B60L 58/26 |
| | | | 429/62 |

\* cited by examiner

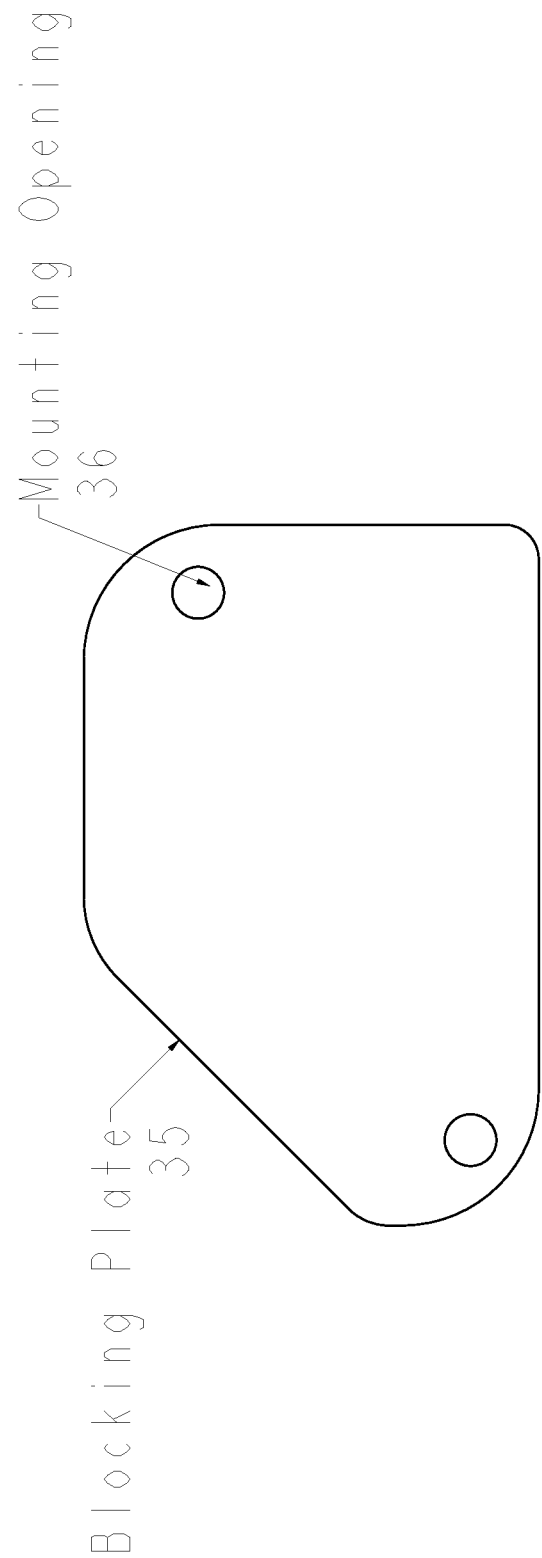

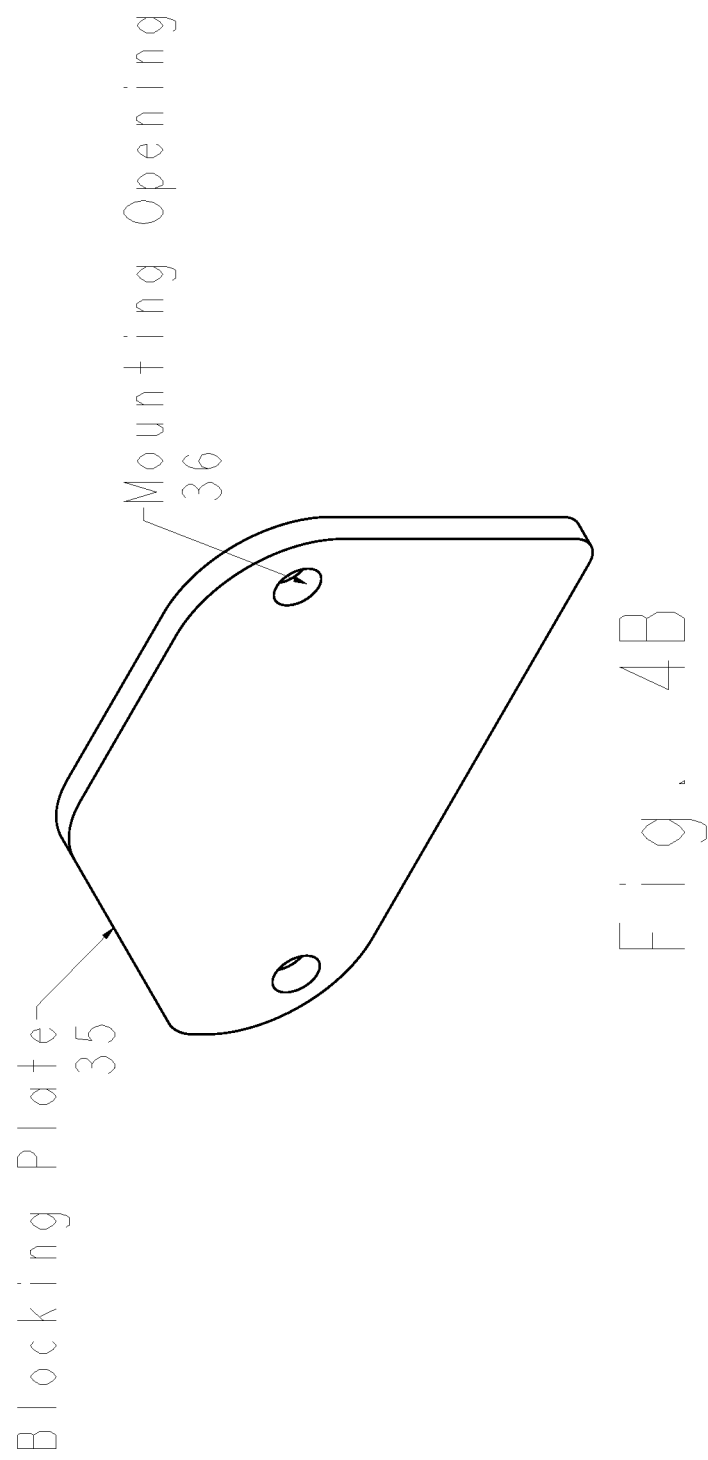

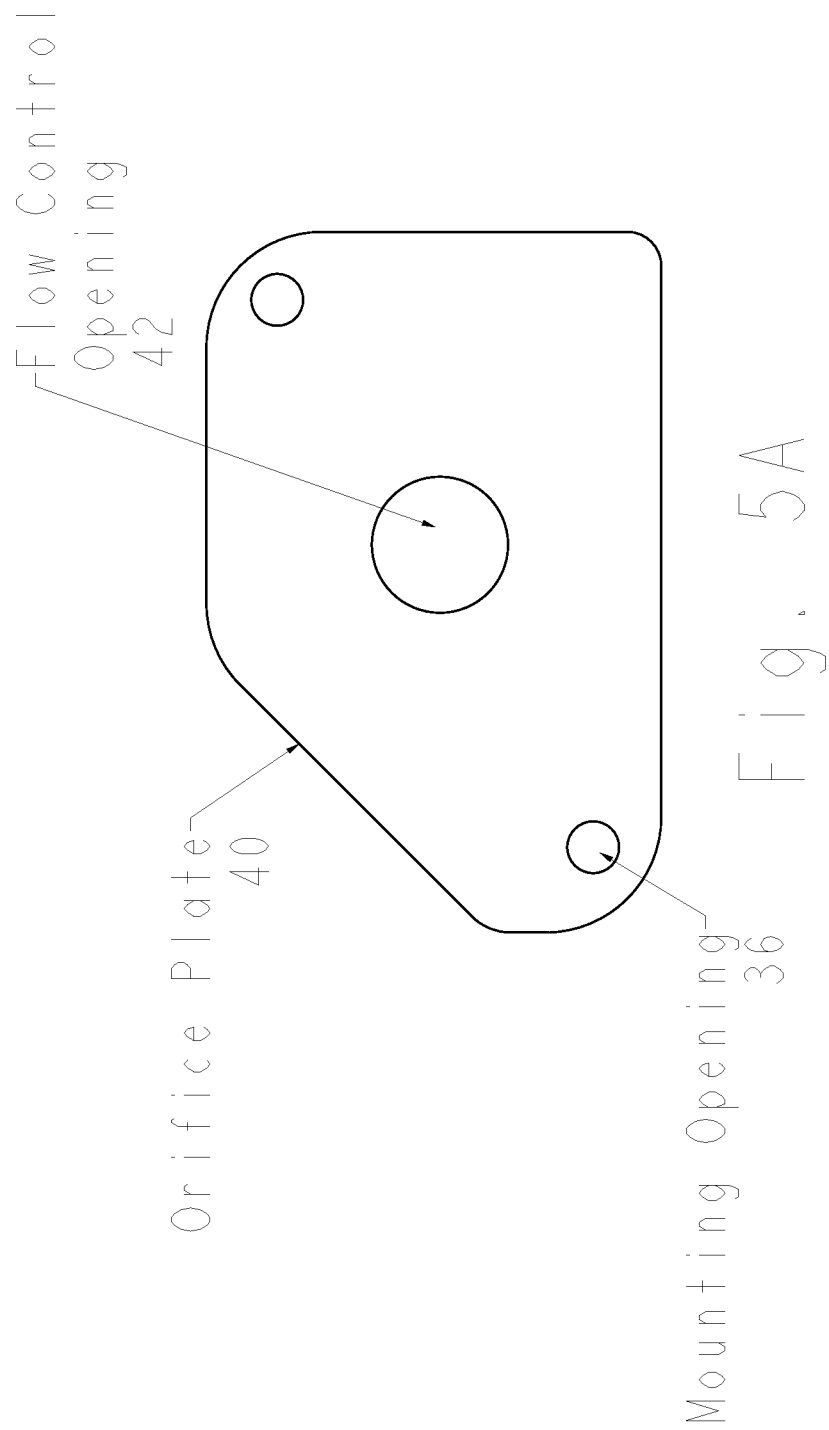

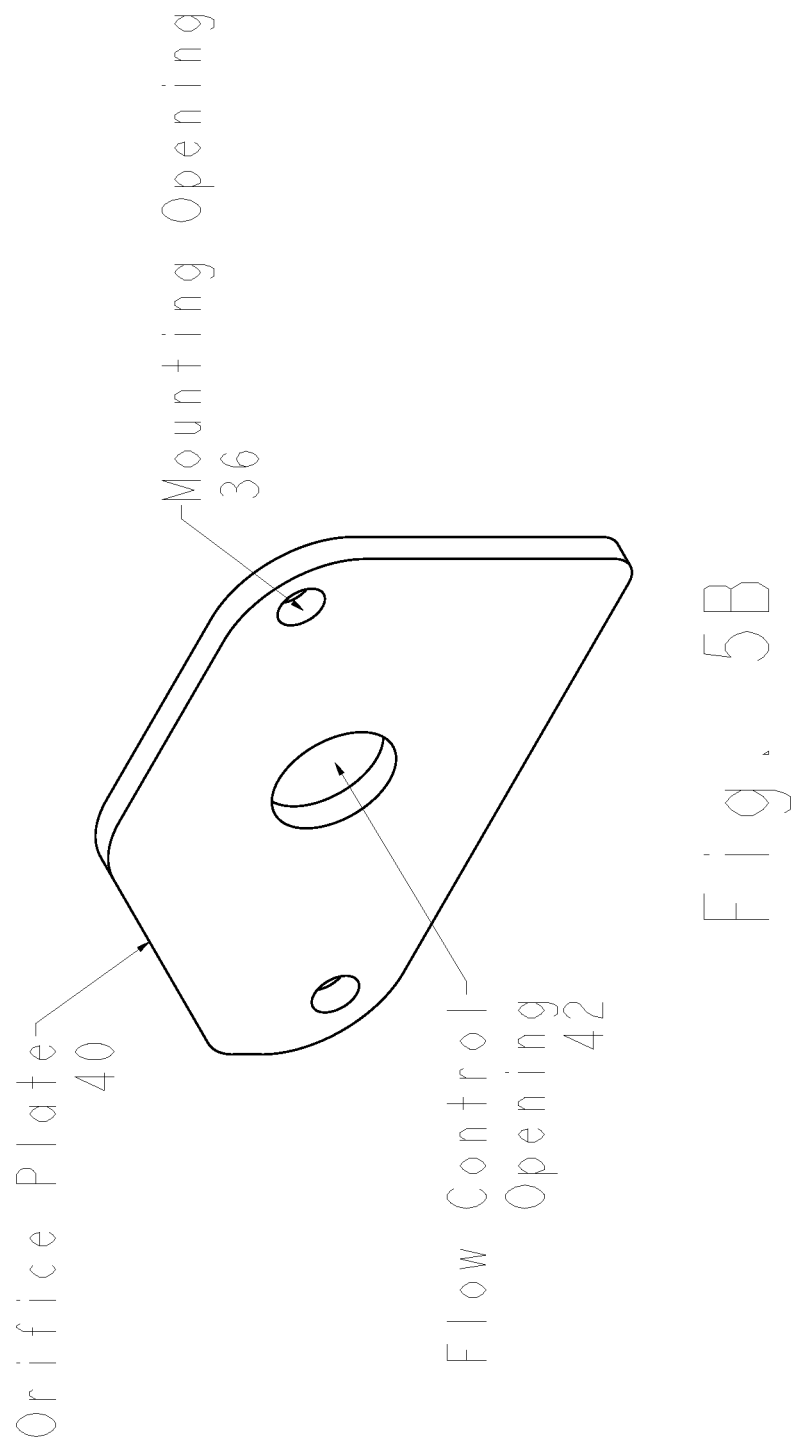

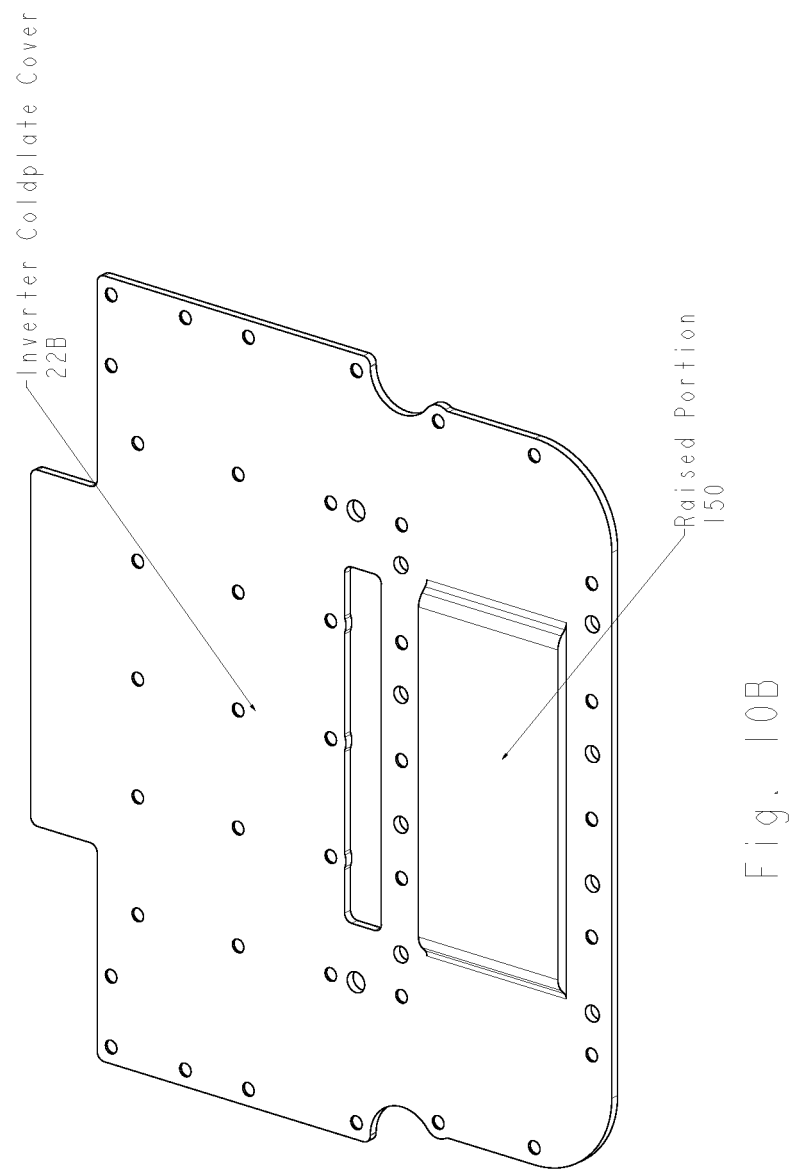

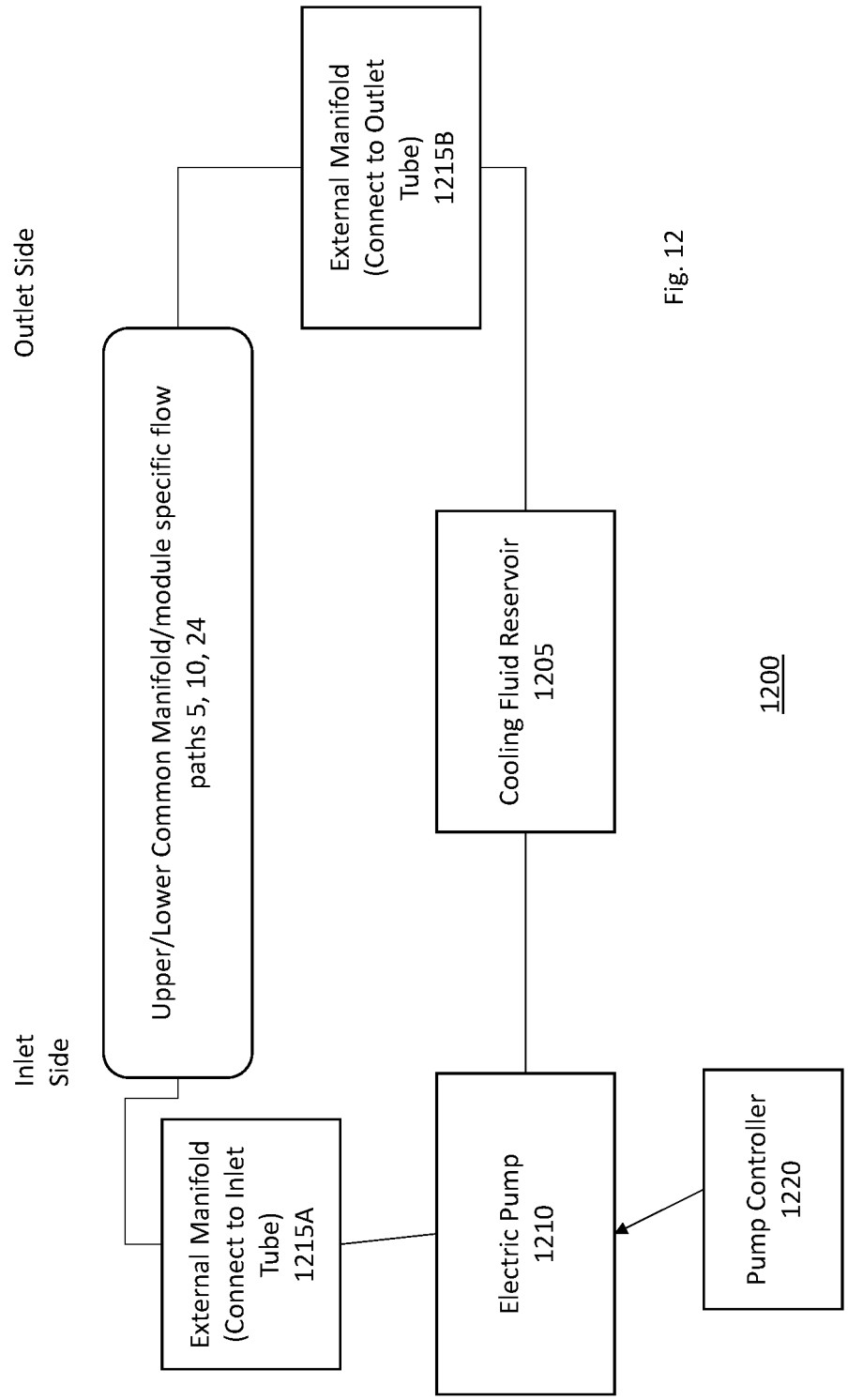

COOLING SYSTEM WITH COMMON MODULAR MANIFOLDS

FIELD OF THE DISCLOSURE

This disclosure relates to cooling systems for a modular power conversion system having a plurality of modules, where some of the modules have different components.

BACKGROUND

Components of a power conversion system may require cooling during operation. Certain cooling systems use cooling fluid to cool the components of the system via heat transfer. The cooling fluid may be introduced into the power conversion system via an inlet and leave the system via an outlet to return to a common reservoir and be pumped back into the power conversion system via the inlet again.

Different power electronics in the power conversion system may have different cooling requirements and required flow rates for the cooling fluid. The different flow rates may require different flow paths for different power electronics, different dimensions of the respective paths including inlets and outlets and path length. This provides a challenge for a cooling system, especially when the power conversion system has a plurality of different modules and the power electronics in some of the modules may be different. The cooling system must route the cooling fluid to a particular module from the inlet, route the cooling fluid within the particular module, route between modules and route to the outlet (and back to the inlet again).

As the number of modules in the power conversion system increase, the routing to, and between modules becomes more difficult. Additionally, the location of modules within the power conversion system and number of modules may be customizable and application specific, and therefore, the cooling system needs to be robust to handle the customization and scaling.

SUMMARY

Accordingly, disclosed is a cooling system for a modular power control system (MPCS). The MPCS comprises a plurality of modules. Each module has a chassis. The chassis comprises a first manifold segment and a second manifold segment. The cooling system comprises an inlet, a first common manifold, a second common manifold, module specific flow paths and an outlet. The first common manifold is formed from the first manifold segment of each module, where when the plurality of modules is mounted to each other, the first manifold segments align to provide a fluid channel between endcaps. The second common manifold formed from the second manifold segment of each module, where when the plurality of modules is mounted to each other, the second manifold segments align to provide a fluid channel between endcaps. The chassis of at least two modules further has a first opening providing a fluid interface region between the first common manifold and a module specific flow path, and a second opening providing a fluid interface region between the module specific flow path and the second common manifold. A module specific flow path provides at least one fluid branch between the first common manifold and the second common manifold for the module. The inlet is in fluid communication with an end of the first common manifold and the outlet is in fluid communication with the other end of the first common manifold or an end of the second common manifold. The inlet is connectable to a fluid source via a pump controlled to provide a set total fluid rate.

In an aspect of the disclosure, each chassis may be thermally conductive.

In an aspect of the disclosure, the endcaps include a first endcap and a second endcap. The first endcap may comprise an inlet tube mounted on an external surface of the first endcap. The inlet tube may have the inlet and a common manifold inlet on opposite ends of the inlet tube. The common manifold inlet may be aligned with the first common manifold. The second endcap may comprise an outlet tube mounted on an external surface of the second endcap. The outlet tube may have the outlet and a common manifold outlet on opposite ends of the outlet tube. The common manifold outlet may be aligned with one of the first common manifold or the second common manifold. The outlet may be connectable to the fluid source to return the fluid to the fluid source.

In an aspect of the disclosure, each of the first manifold segments and the second manifold segments have a shelf configured to receive a blocking plate or an orifice plate. The blocking plate is configured to block fluid from flowing to a downstream manifold segment in a common manifold which the blocking plate is mounted. The orifice plate may comprise an opening. The orifice plate (with the opening) is configured to control flow rates of fluid within the first common manifold, the second common manifold and the module specific flow paths.

In an aspect of the disclosure, the position of the blocking plate or of the orifice plate may be based on a number of the plurality of modules. In an aspect of the disclosure, the position of the blocking plate or of the orifice plate may be based on types of the plurality of modules in the MPCS. The type of module may be a control module, an inverter module, a DC interface module, a DC filter module, or a junction module.

In an aspect of the disclosure, the MPCS may be installed in a battery electric vehicle (BEV) or a hybrid electric vehicle (HEV). The MPCS may have a different configuration based on when the MPCS is installed in the BEV or the HEV. For example, when the MPCS is installed in a BEV, the MCPS may comprise the control module, three inverter modules, the DC interface module, at least one junction module and the DC filter module. The blocking plate may be positioned between one of the inverter modules and the DC interface module and the orifice plate may be positioned between the control module and one of the inverter modules. Another orifice plate may be positioned between the second endcap and the DC filter module such as mounted in a shelf in the endcap. In an aspect of the disclosure, the second endcap may further comprise a bypass column in fluid communication with the first common manifold and the second common manifold. The orifice plate may be positioned between the DC filter module and the second endcap and a size of the opening in the orifice plate may determine ratios of flow between module specific flow paths for the DC filter module and the DC interface module, respectively and flow into the bypass column.

In an aspect of the disclosure, the opening in the orifice plate may have a diameter between about 2 mm and about 20 mm.

In an aspect of the disclosure, the flow rate or rates within the module specific flow path may be different for the different types of modules and the path(s) may be different for different modules within the MPCS. For example, the module specific flow path for inverter module may comprise multiple branches and the flow rates in the different branches may be different.

In an aspect of the disclosure, the fluid may be water-ethylene-glycol.

In an aspect of the disclosure, the total flow rate into the inlet is between about 40 liters-per-minute (LPM) and about 54 LPM.

In an aspect of the disclosure, there may be two types of inverter modules such as when the MPCS is installed in a HEV. For example, there may be a three-phase out inverter module and a single-phase out inverter module. The flow rate within the module specific flow path for the three-phase out inverter module may be different than the flow rate within the module specific flow path for the single-phase out inverter module.

In an aspect of the disclosure, a blocking plate may be positioned between one of the single-phase out inverter modules and the three-phase out inverter module.

BRIEF DESCRIPTION OF DRAWINGS

FIG. 1 shows the endcaps and a plurality of module chassis, each module chassis has segments for common manifolds, and the common manifolds provide internal chassis channels for a cooling fluid used in a cooling system in accordance with aspects of the disclosure;

FIGS. 4A and 4B illustrate views of a blocking plate in according with aspects of the disclosure;

FIGS. 5A and 5B illustrate views of an orifice plate in accordance with aspects of the disclosure;

FIG. 10B illustrates an example of a coldplate cover for an inverter module in accordance with aspects of the disclosure;

FIG. 12 illustrates a block diagram of a cooling system in accordance with aspects of the disclosure;

DETAIL DESCRIPTION

Aspects of the disclosure provide a cooling system and method for cooling power electronics in a plurality of modules. The plurality of modules may be included in a modular power control system (MPCS). A MPCS is a modular line replaceable unit (LRU) containing a plurality of inverters modules and high voltage power distribution. The MPCS is scalable and customizable to have any number of inverters modules and current interfaces. Different inverter modules may provide different phases of power. The current interfaces may be in a DC interface module(s), a DC filter module(s) or a junction module(s). The DC interface module may have a plurality of DC interfaces configured to receive DC power from an external source. The DC interface module may also include isolation monitoring and control of high voltage power distribution and low voltage power distribution in the MPCS.

The DC filter module has filtered DC interfaces. The DC interfaces in the DC filter module may comprise a fuse, contactor(s), voltage, and/or current sensors or some combination thereof. In some aspects of the disclosure, the DC filter module may comprise multiple DC busbars to support high speed and low speed charging. The charging may be seeded by an external power source such as an external battery. For example, the DC filter module may comprise high speed DC busbars (high speed interface) and multiple low speed DC busbars (low speed interfaces). The specific current supported by the DC busbars in the DC filter module and respective interfaces may be based on a specific application.

The DC junction module may comprise a plurality of DC interfaces. The interfaces may be unfiltered. Each interface may comprise a fuse, contactor(s), voltage and/or current sensors or some combination thereof. In some aspects of the disclosure, each DC junction module may comprise 4 different interfaces. However, the number of interfaces is not limited to 4.

The MPCS may also comprise a control module having hardware for controlling the inverter modules. In some aspects of the disclosure, different hardware may be used to control N-phase out inverter modules and multiple single phase out inverter module. N represents the number of phases out of the inverter module. For example, N may be 3.

Figure 1:
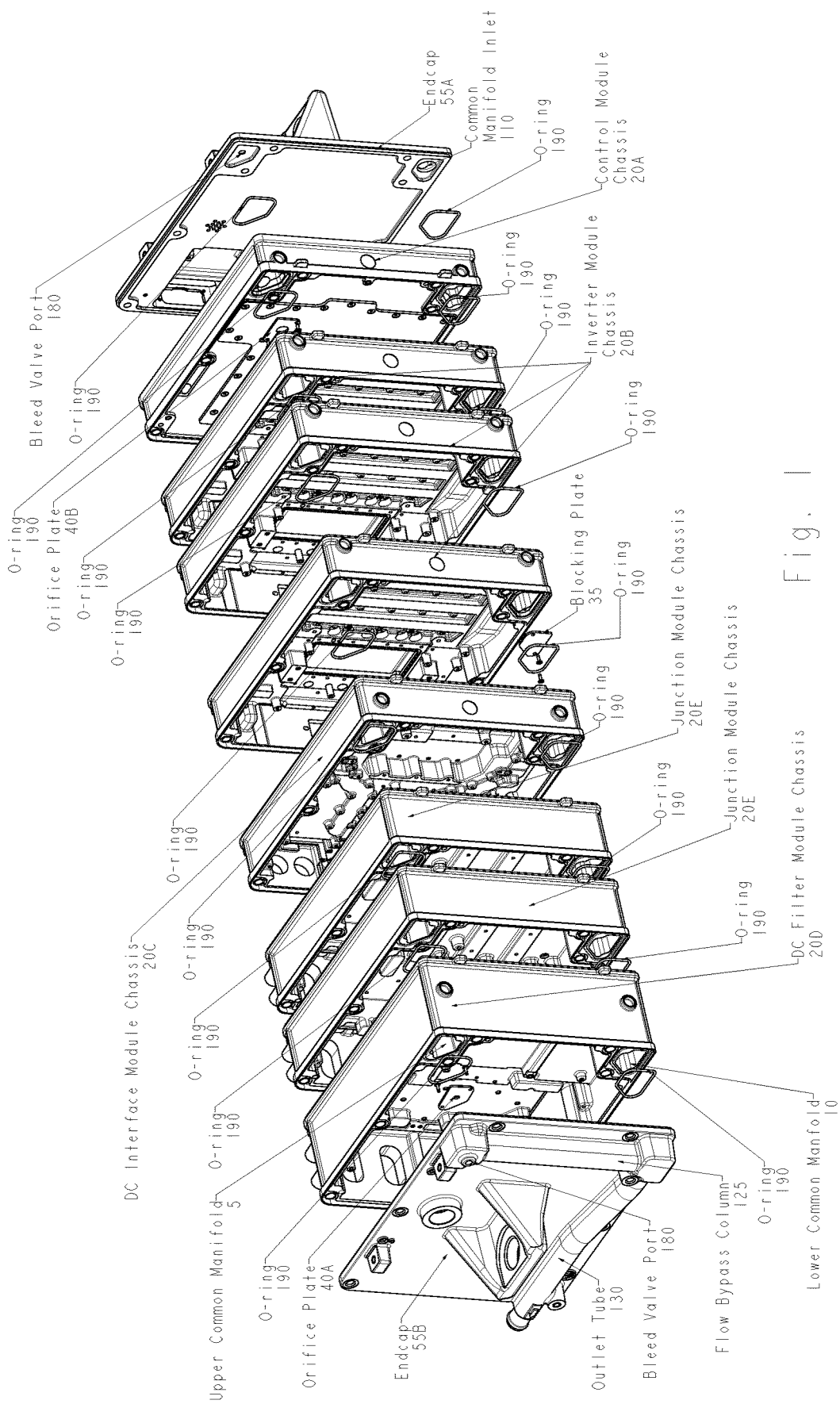
FIG. 1 illustrates an exploded view of an example of a modular power control system in accordance with aspects of the disclosure, where
Figure 13:
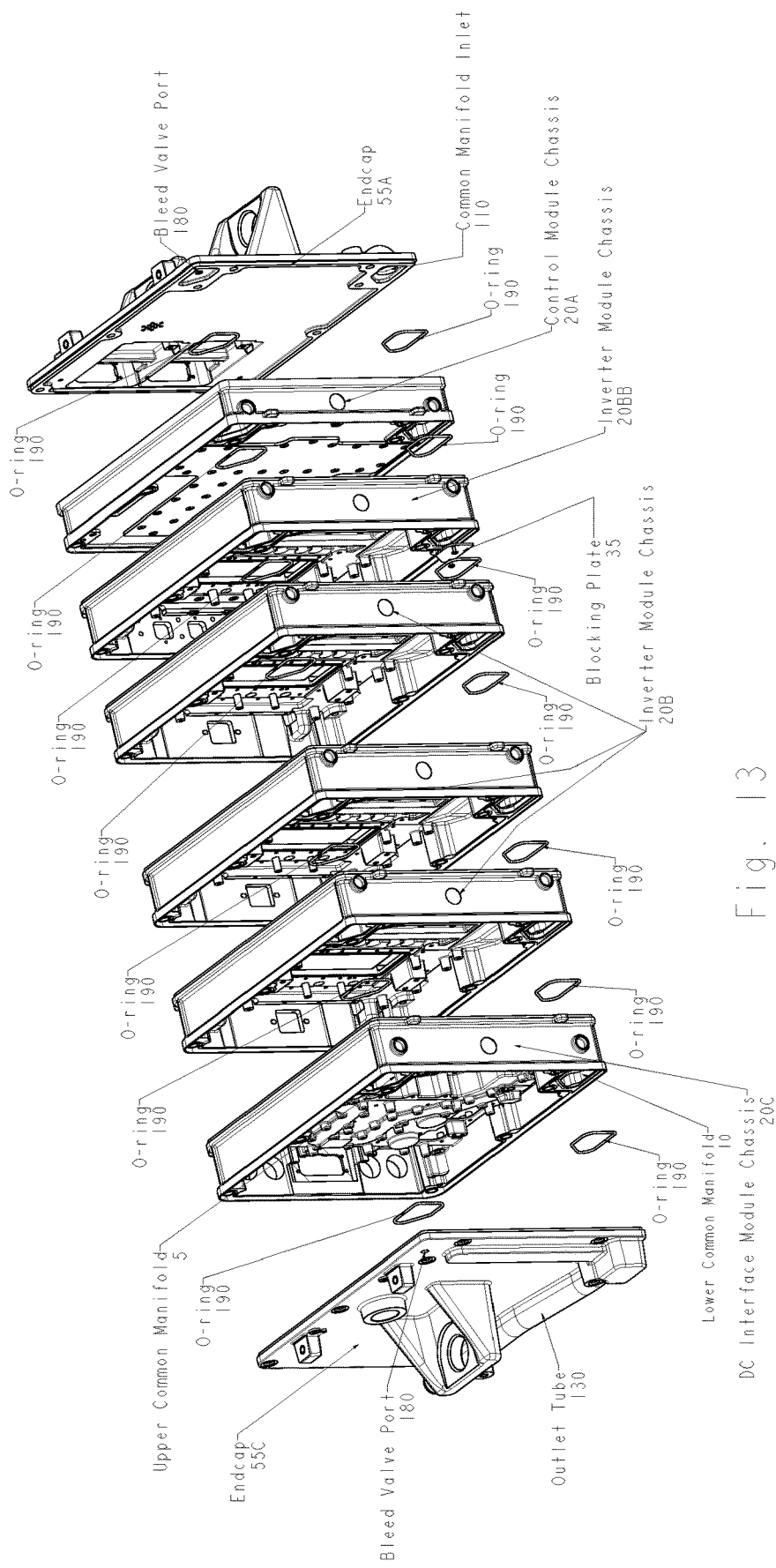
FIG. 13 illustrates an exploded view of another example of a modular power control system in accordance with aspects of the disclosure showing the endcaps and a plurality of module chassis, each module chassis has segments for common manifolds and the common manifolds provide internal chassis channels for a cooling fluid used in a cooling system in accordance with aspects of the disclosure.

The number different modules, the number of each type of module and the specific position of the modules within the MPCS may be application specific. The MPCS may be installed in a vehicle such as a battery electric vehicle (BEV) (an example configuration is shown in FIG. 1) or a hybrid electric vehicle (HEV) (an example configuration is shown in FIG. 13). In some aspects of the disclosure, when used in an HEV, the DC junction module and/or the DC filter module may be omitted. The vehicle may be a personal vehicle, such as a scooter, car, motorcycle and truck or a commercial vehicle such as a truck or bus, a maritime vehicle such as a boat or submarine or a military vehicle such as a tank, self-propelled artillery, or troop transport. The vehicle may also be an airplane, a helicopter, UAV and other powered air vehicles. Larger vehicles may require more power and thus more interfaces and modules.

Each module has a module chassis (referenced as "20"). The module chassis 20 for each type of module has a similar shape. The module chassis 20 has a base. The base may be substantially rectangular. The module chassis 20 also has sidewalls. An example of different module chassis 20 are illustrated in FIG. 1 (control module chassis 20A, an inverter module chassis 20B, DC interface module chassis 20C, DC filter module chassis 20D and junction module chassis 20E). Each chassis 20A-20E has substantially the same footprint such that the chassis 20A-20E may be mounted together and align.

The cooling system 1200 (block diagram of which is illustrated in FIG. 12) in accordance with aspects of the disclosure has multiple common manifolds 5, 10 internal to the MPCS. The common manifolds 5. 10 are internal to the chassis 20. The term "common" refers to the manifold running through each of the modules. The multiple common manifolds include an upper common manifold 5 and a lower common manifold 10. Upper and lower referring to the relative position of the manifolds in operation. Both the upper common manifold 5 and the lower common manifold 10 are formed from segments or sections (manifold segments 15). Each chassis 20 has a manifold segment 15 for the upper common manifold 5 and a manifold segment 15 for the lower common manifold 10.

FIG. 1 illustrates an exploded view of an example of a MPCS (without the power electronics and control components depicted). The example configuration illustrated in FIG. 1 is for a BEV application. The exploded view illustrates the upper common manifold 5 and the lower common manifold 10 (in its constituent segments). The exploded view illustrates the alignment of the manifold segments 15 in each chassis 20. When the chassis 20 are mounted to each other, the manifold segments 15 for the upper common manifold 5 align forming a fluid channel from one end of the MPCS to the other end of the MPCS (between the endcaps 55A/55B).

Similarly, when the chassis 20 are mounted to each other, the manifold segments 15 for the lower common manifold 10 align forming a fluid channel from one end of the MPCS to the other end of the MPCS (between endcaps 55A/55B). Since the common manifolds 5, 10 are formed from manifold segments 15, the common manifolds 5, 10 are scalable and the length is based on the number of modules and the type of modules. As illustrated in FIG. 1, the upper common manifold 5 and the lower common manifold 10 is positioned in the upper and lower corners of the chassis 20 of each module. However, in other aspects, the position is not limited to the corners.

Figure 3:
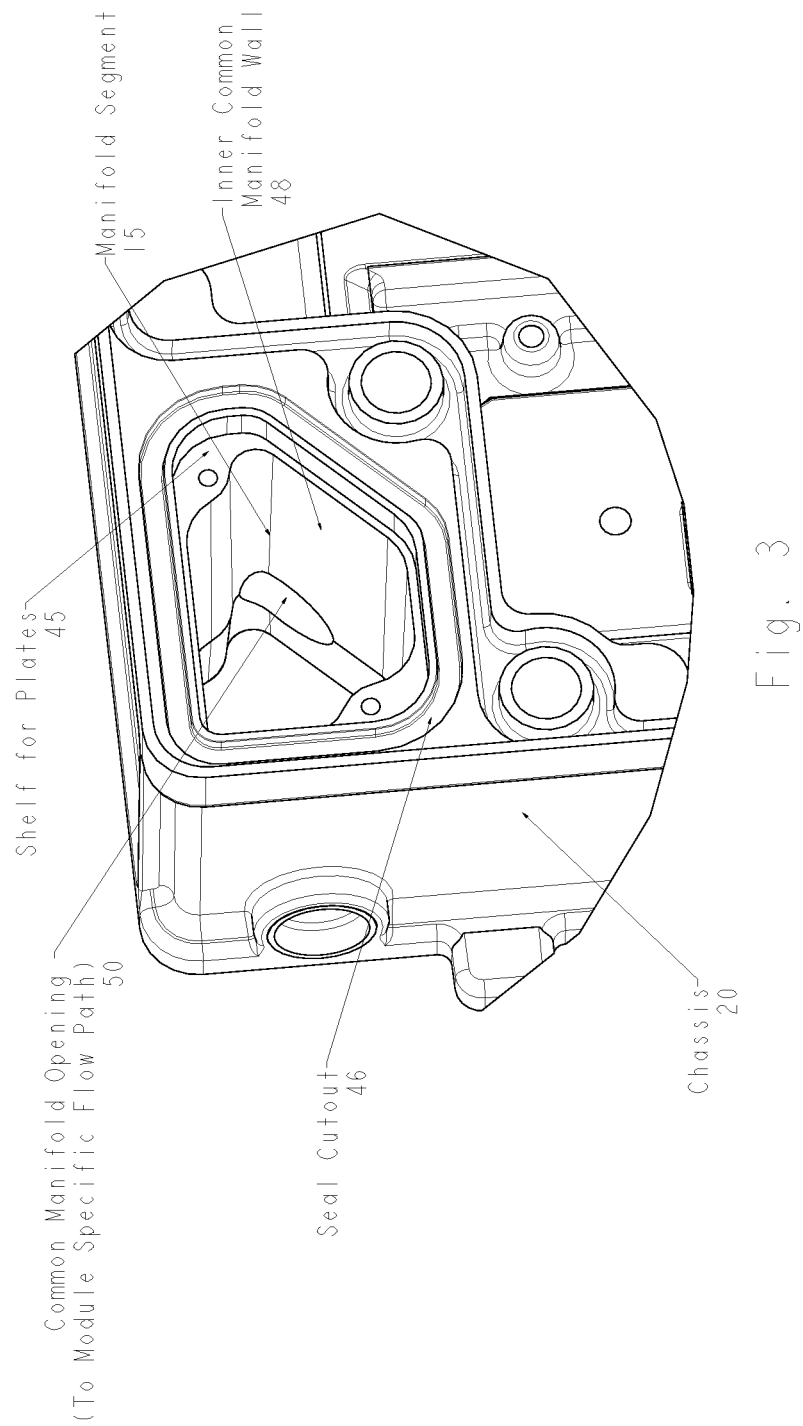
FIG. 3 illustrates a view of an example of a manifold segment showing a cutout for a sealing elastomer and a shelf for plates in accordance with aspects of the disclosure.

FIG. 3 illustrates an example of a manifold segment 15 in accordance with aspects of the disclosure. A manifold segment 15 formed from a least one outer sidewall of the chassis 20 and an inner chassis wall, e.g., an inner common manifold wall 48. As illustrated in FIG. 3, since the manifold segment 15 is in the corner of the chassis 20, the manifold segment 15 has two outer sidewalls. The base of the chassis 20 has a through-hole enabling flow between segments 15 from different modules. The two outer sidewall and the inner common manifold wall 48 define the cross-sectional area for the segment 15. The cross-sectional area may be a function of the fluid volume required for the MPCS. In an aspect of the disclosure, to make the upper common manifold 5 and the lower common manifold 10 scalable, each segment 15 has the same cross-sectional area for alignment. The flow rate/volume within a specific module may be controlled via blocking plates 35 and orifice plates 40 as will be described later.

Figure 6:
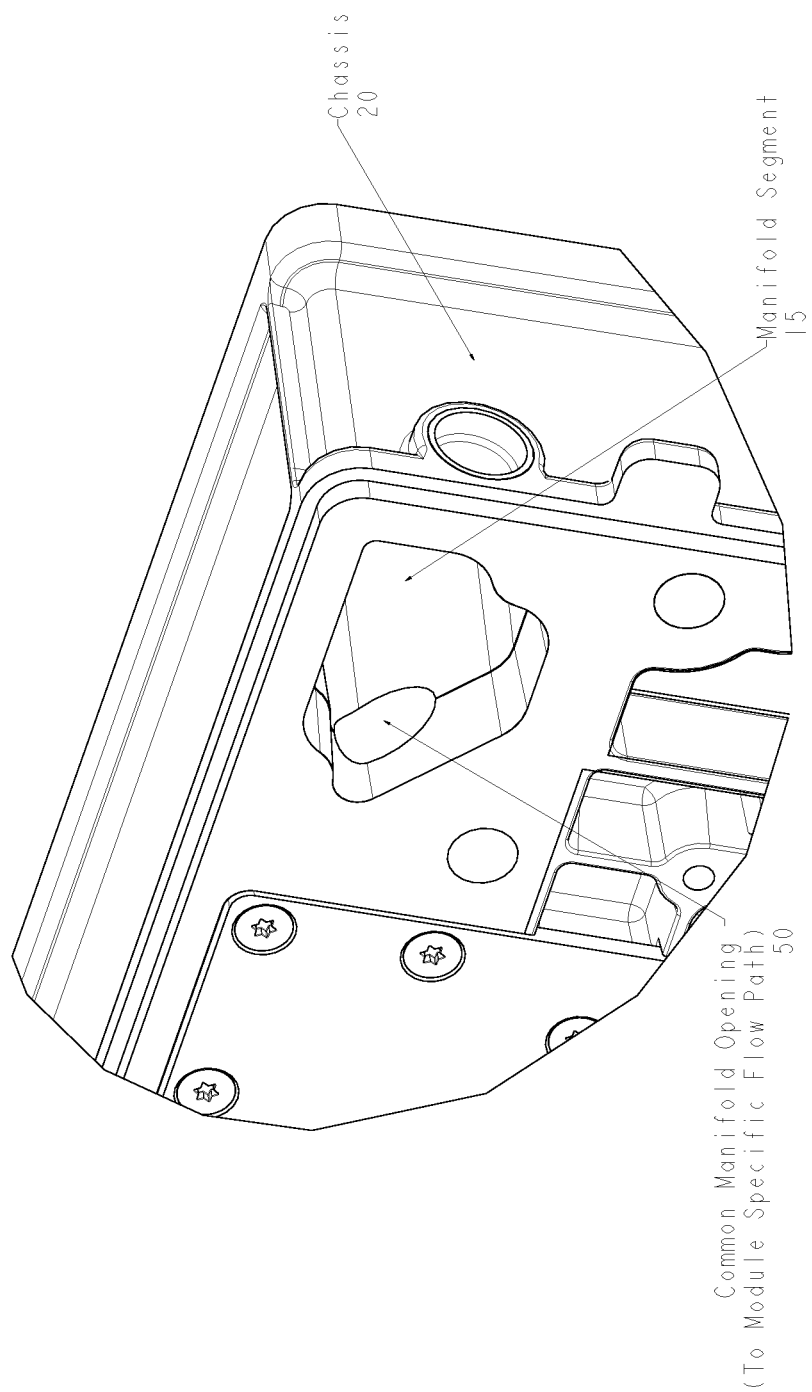
FIG. 6 illustrates a view of an example of a manifold segment showing an opening from the common manifold into a module specific flow path in accordance with aspects of the disclosure.

Each manifold segment 15 also has a common manifold opening 50 (such as shown in FIGS. 3 and 6) which leads to a module specific flow path (collectively referred to herein as "24"). Specifically, the inner common manifold wall 48 has an opening 50. The opening 50 provides a fluid interface region between the common manifold(s) and the module specific flow path 24. In an aspect of the disclosure, the opening 50 in each manifold segment 15 may be the same diameter. This is to allow for the flow rate control/volume control to be controlled by the blocking plates 35 and orifice plates 40 and total flow rate as will be described later. However, in other aspects of the disclosure, the flow rate/volume to a module specific flow path 24 may be controlled by using different sizes of the diameter of the opening 50 in different manifold segments 15 as well. Opening 50 may provide an inlet or an outlet for the module specific flow paths 24 depending on the direction of flow within the module specific flow path 24, which is another advantage of having segmented common manifolds 5, 10 as there is no dedicate inlet or outlet for a module.

Each manifold segment 15 also has a shelf or slit 45 such as illustrated in FIG. 3 for a plate, such as a blocking plate 35 or orifice plate 40. Each manifold segment also has a seal cutout 46 (not labeled) for a sealing elastomer such as an o-ring 190. The o-ring 190 provides a fluid seal between the modules when the chassis 20 are stacked and mounted to each other (and connected via a threaded rod into chassis connection openings 18). While each manifold segment 15 has a shelf 45 for the plates 35, 40, the plates 35, 40 may only be mounted to selected manifold segments 15 as needed to control the flow rate/volume to and within the module specific flow paths 24. However, to provide the scalability and customization, each manifold segment 15 has the shelf 45. The position of the plates 35, 40 may be based on the application such as BEV v. HEV, the number of modules, and the type of modules. The application is not limited to BEV and HEV. For example, a modular power system may be used in building.

FIGS. 4A and 4B illustrate an example of a blocking plate 35 in accordance with aspects of the disclosure. A blocking plate 35 has mounting opening(s) 36. The mounting opening(s) 36 are for mounting the blocking plate 35 to a manifold segment 15. FIGS. 4A and 4B illustrate two openings. The manifold segment 15 has corresponding openings for mounting hardware. The mounting hardware may include a bolt or screw. A washer may also be used.

Figure 15A:
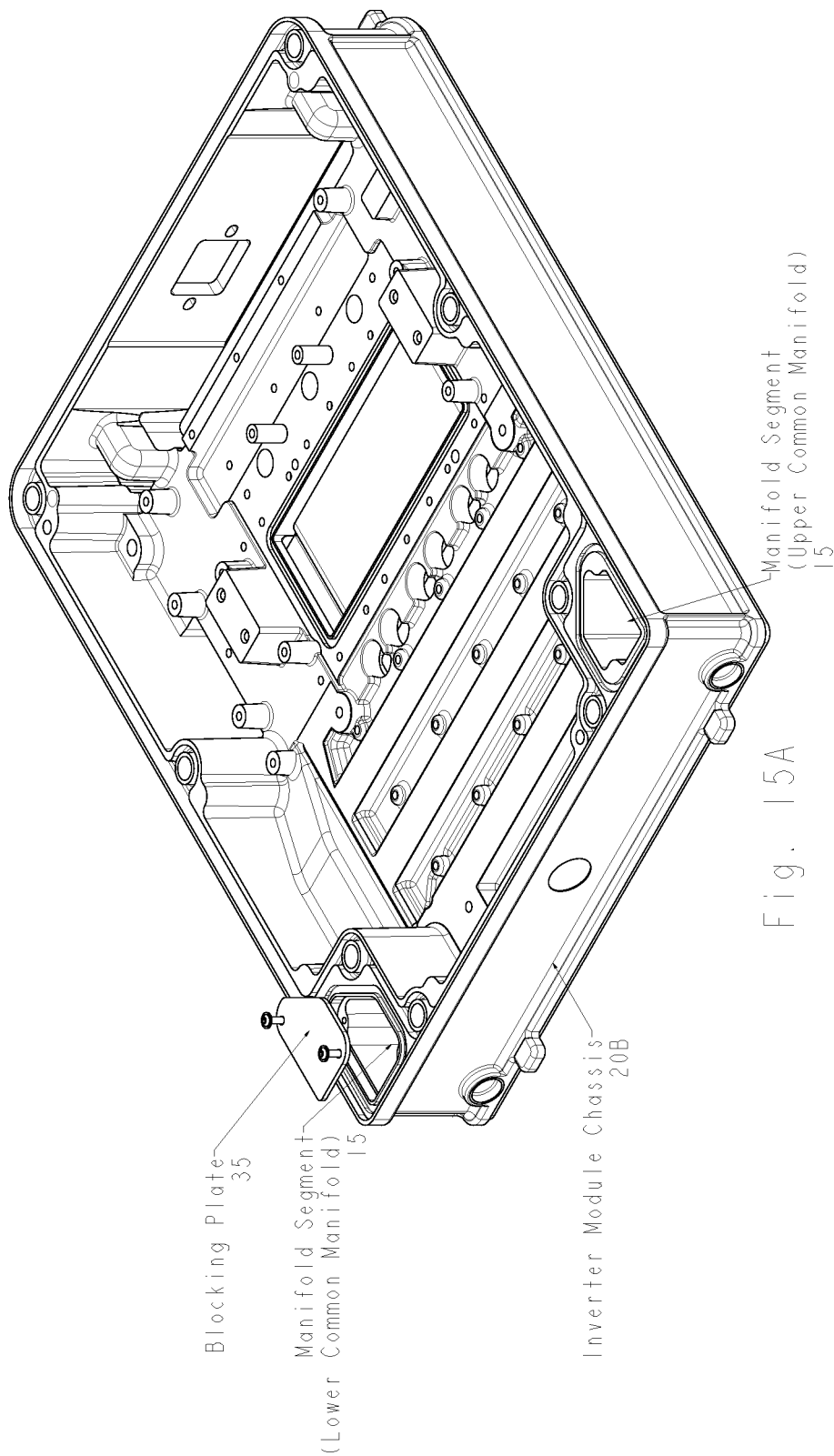
FIG. 15A illustrates an exploded view of an example of an inverter module chassis and blocking plate in accordance with aspects of the disclosure.
Figure 15B:
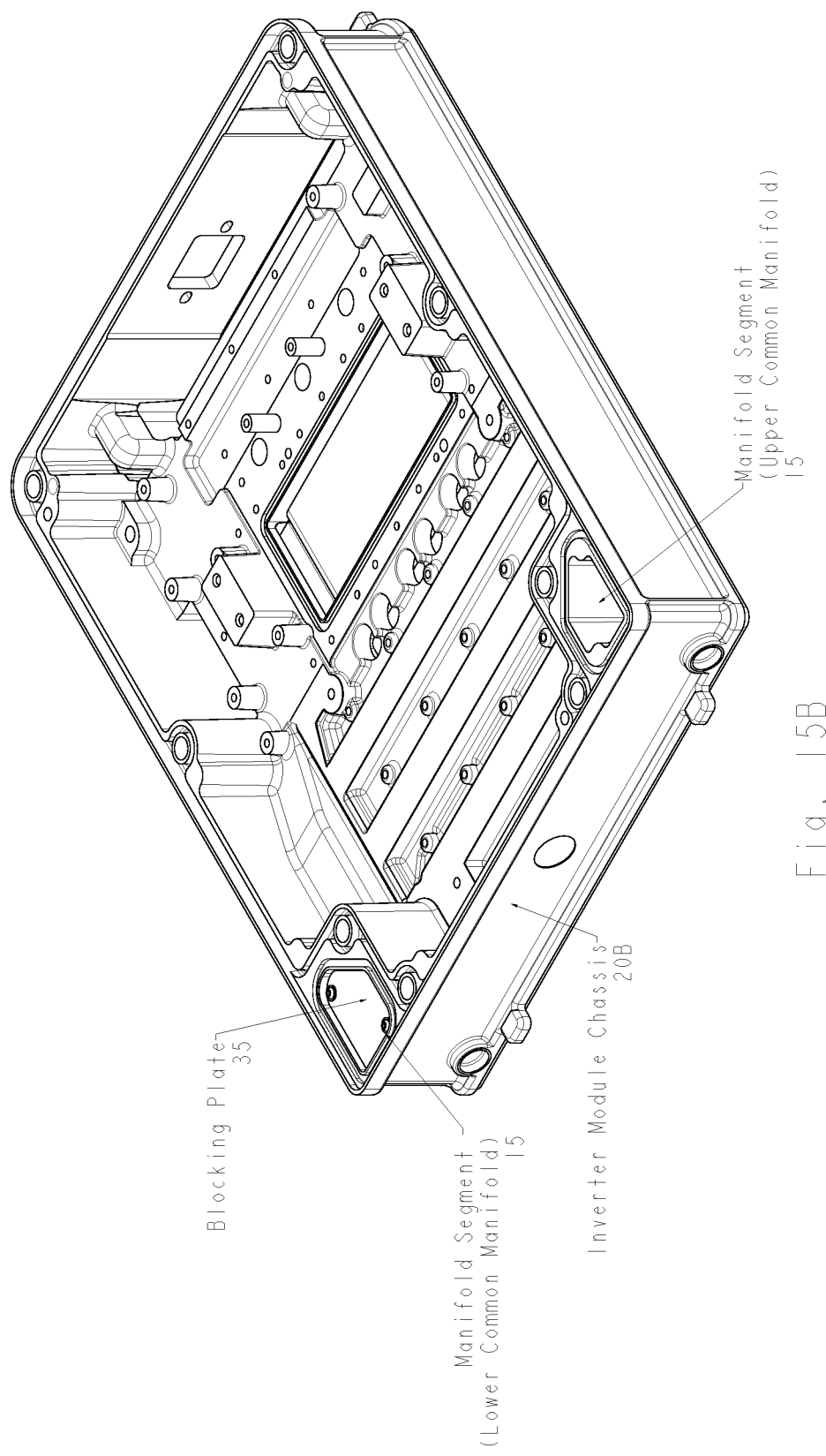
FIG. 15B illustrates a perspective view of an example of an inverter module chassis having a blocking plate installed in accordance with aspects of the disclosure.

FIG. 15A illustrates an exploded view of an example of a blocking plate 35 for a manifold segment 15 (such as for the lower common manifold 10) for an example inverter module chassis 20B. First, the blocking plate 35 is mounted to the shelf 45 The mounting hardware is then inserted through both the mounting openings 36 and corresponding openings in the manifold segment 15. The sealing elastomer is inserted in the seal cutout 46 to create a seal between modules. FIG. 15B illustrates the blocking plate 35 mounted in a manifold segment 15 (associated with the inverter module chassis 20B) for the lower common manifold 10.

The blocking plate 35 may be a metallic plate. In an aspect of the disclosure, the blocking plate 35 is configured to re-direct the fluid from one of the common manifolds to the other common manifold via the module specific flow paths 24 upstream of the blocking plate 35. For example, if the blocking plate 35 is installed in a manifold segment 15 for the lower common manifold 10, the fluid cannot pass the blocking plate 35 and continue along the lower common manifold 10. Instead, the fluid is redirected into the module specific flow paths upstream via the respective opening(s) 50. The fluid reaches the upper common manifold 5 via the module specific flow paths 24 upstream of the blocking plate 35.

The position and number of blocking plates 35 used may be application specific such as for a vehicle or type of vehicle including whether the vehicle is a BEV v. HEV. As shown in the example illustrated in FIG. 1, a blocking plate 35 is installed between an inverter module and the DC interface module (mounted in the inverter module chassis 20B).

FIGS. 5A and 5B illustrate an example of an orifice plate 40 in accordance with aspects of the disclosure. The orifice plate 40 has a flow control opening 42. This flow control opening 42 may be in the central portion of the orifice plate 40. The size (diameter) of the opening may control the flow rate/volume such as in liters-per-minute. The size of the opening may be application specific such as for a vehicle or type of vehicle including whether the vehicle is a BEV v. HEV, the position of the orifice plate 40 within the MPCS and number of modules. Different orifice plated may be installed within a system and have different sized flow control openings 42. In some aspects of the disclosure, the flow control opening 42 may be between 2 mm and 20 mm. The larger the opening the slower the flow. In an aspect of the disclosure, the orifice plate 40 may be installed in a different common manifold than the blocking plate 35. The orifice plate 40 also has mounting opening(s) 36. The mounting opening(s) 36 are for mounting the orifice plate 40 to a manifold segment 15. FIGS. 5A and 5B illustrate two openings. The orifice plate 40 may be the same material as the blocking plate 35.

In the example illustrated in FIG. 1, two orifice plates 40A and 40B are used. Orifice plate 40B is installed between the control module and one of the inverter modules (mounted in the control module chassis 20A). In the example, the combination of the blocking plate 35 and the orifice plate 40B controls the flow rate in the control module flow path 24A and inverter module flow paths 24B. For example, fluid enters the lower common manifold 10 and reaches the blocking plate 35. The fluid is redirected via the respective opening(s) 50 into the control module flow path 24A and inverter module flow paths 24B. When the fluid reaches the top of the control module flow path 24A it enters the orifice plate 40B via opening 42. Since fluid also enters the upper common manifold 5 from the inverter modules via the respective opening 50, the fluid flows into the DC interface module chassis 20C (in the example illustrated in FIG. 1).

The size of the diameter of the flow control opening 42 in the orifice plate 40 impacts the flow rate for the control module flow path 24A and the inverter module flow paths 24B. For example, the smaller the diameter of the flow control opening 42, the higher the flow rate is in the inverter flow paths 24B.

Figure 2:
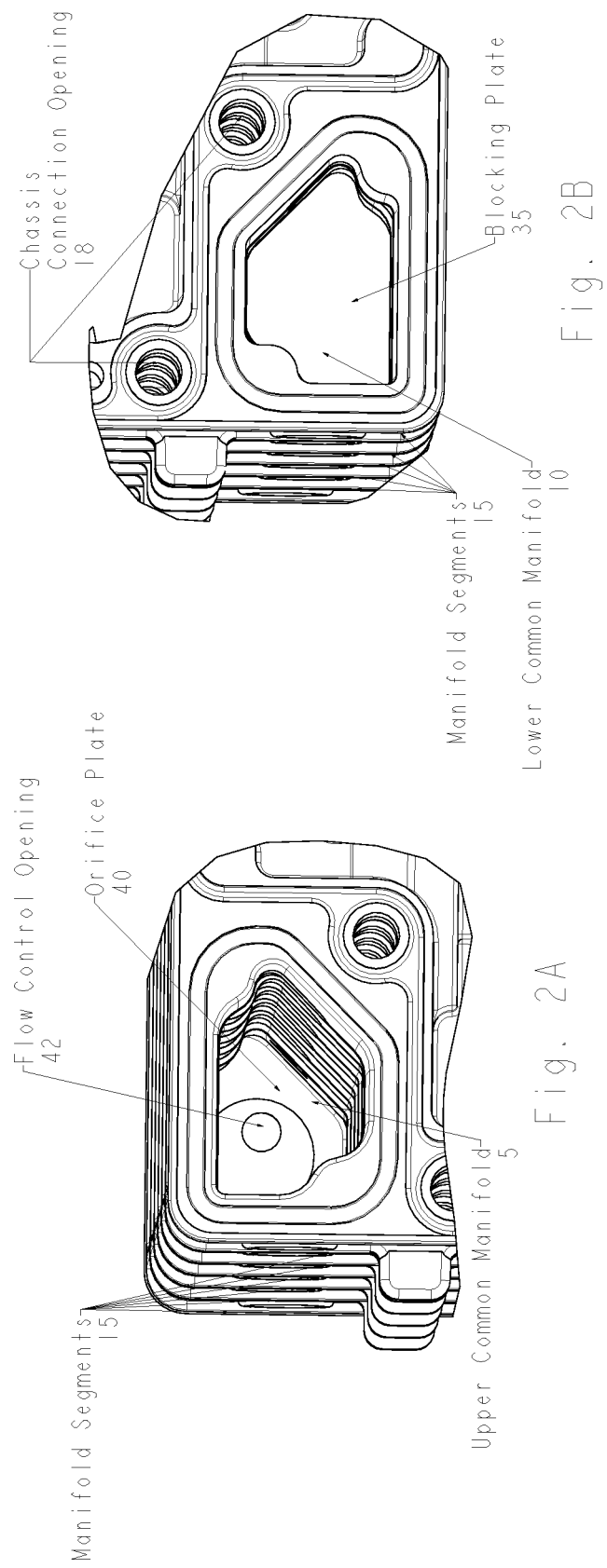
FIG. 2A illustrates a view of an example of an upper common manifold formed from a plurality of manifold segments in accordance with aspects of the disclosure.
FIG. 2B illustrates a view of an example of a lower common manifold formed from a plurality of manifold segments in accordance with aspects of the disclosure.

FIG. 2A illustrates a view showing a fluid channel created within an example of an upper common manifold 5 in accordance with aspects of the disclosure. As illustrated in FIG. 2A, an orifice plate 40 is installed in the upper common manifold 5 (in one of the manifold segments 15). In the view, the orifice plate 40 is in a distal manifold segment 15. FIG. 2A illustrates a plurality of manifold segments 15 stacked. A fluid channel is formed by the segments. The flow control opening 42 is shown distal in the stack.

FIG. 2B illustrates a view showing a fluid channel created within an example of a lower common manifold 10 in accordance with aspects of the disclosure. As illustrated in FIG. 2B, a blocking plate 35 is installed in the lower common manifold 10 (in one of the manifold segments 15) which blocks the fluid channel path.

Figure 7:
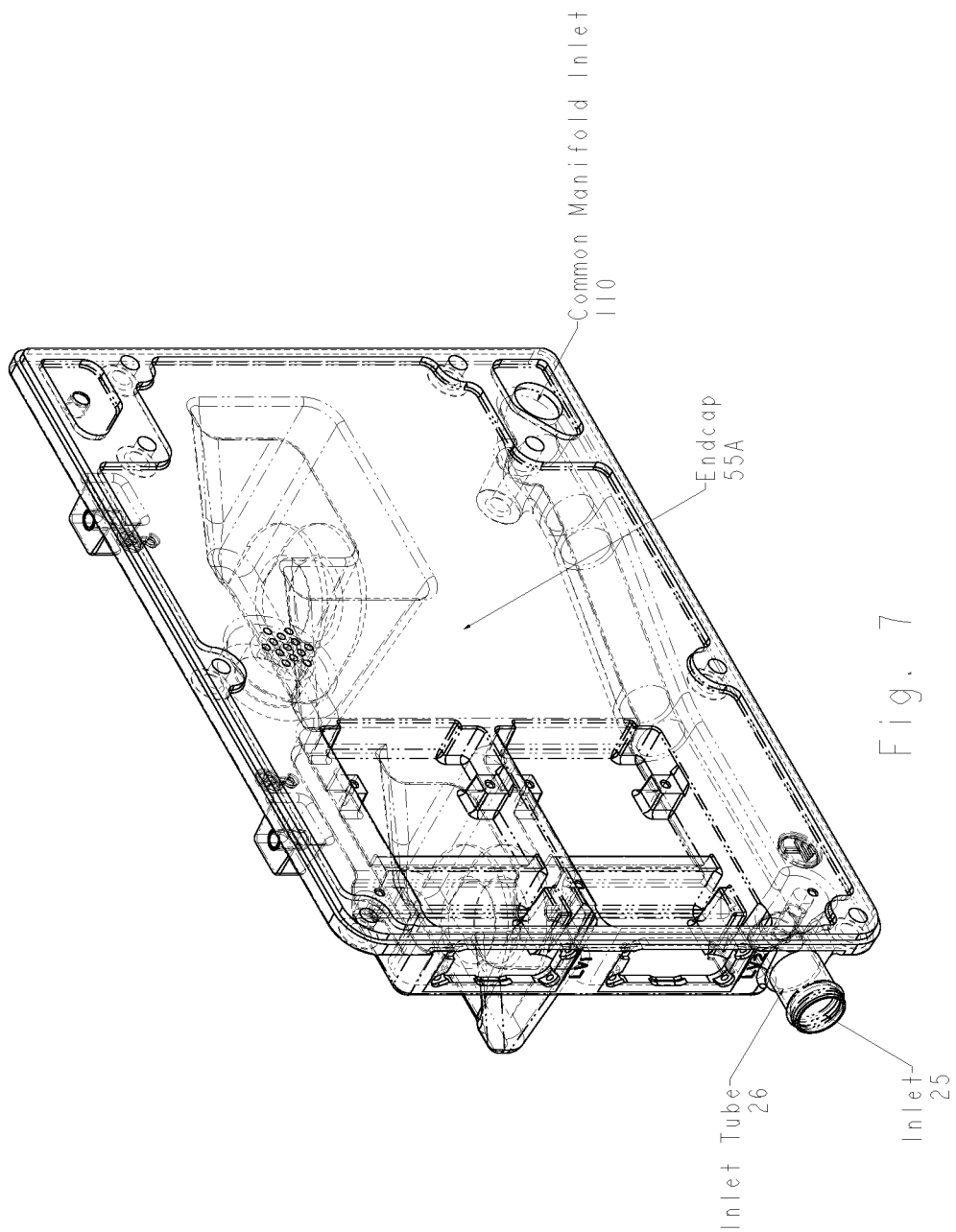
FIG. 7 illustrates a perspective view of an endcap having an inlet for fluid for a cooling system in accordance with aspects of the disclosure.

The MPCS also has endcaps 55A, 55B, an example of which is shown in FIG. 1. The endcaps 55A, 55B are mountable to the ends of the MPCS. Endcap 55A is on the inlet side of the flow paths and endcap 55B is on the outlet side of the flow paths. FIG. 7 illustrates an example of endcap 55A in accordance with aspects of the disclosure. The endcap 55A comprises a plate. In some aspects of the disclosure, the plate may be a thermally conductive plate. An inlet tube 26 may be mounted on one side of the endcap 55A (external side). In FIG. 7, dots and dashes represent hidden lines of objects that are not viewable in the view. In the perspective view, the inlet tube 26 is shown in the hidden lines. The inlet tube 26 may extend substantially parallel to the plate of the endcap 55A. In some aspects of the disclosure, the diameter of the inlet tube 26 may be about 3 times the size as the diameter of the module specific flow paths 24. An open end of the inlet tube 26 may have inlet 25. The inlet 25 may be connected to tubes, pipes (such as the external manifold 1215A) for input of fluid for the cooling system 1200. The inlet tube 26 may extend from a front of the endcap 55A to a back of the endcap 55A. The inlet tube 26 may curve to enter the plate of the endcap 55A. The endcap 55A may have an opening (common manifold inlet 110) to connect the tube 26 to the common manifold such as the lower common manifold 10. The connection is not limited to the lower common manifold 10 and the tube 26 may be connected to the upper common manifold 5. The inlet tube 26 is not shown in FIG. 1.

The common manifold inlet 110 has a diameter D. The diameter D also controls the flow rate/volume of the fluid. In some aspects of the disclosure, the diameter D may be about 24 mm. The diameter D may be set based on a target pressure drop between the inlet 25 and outlet 30. For example, the target pressure drop may be less than 5 psi. The pressure drop is a function of the flow control opening, the diameter of the common manifold inlet 110 and the diameter of the common manifold opening 50. The diameter D may be application specific to a vehicle or type, number of modules and types of modules.

Figure 8:
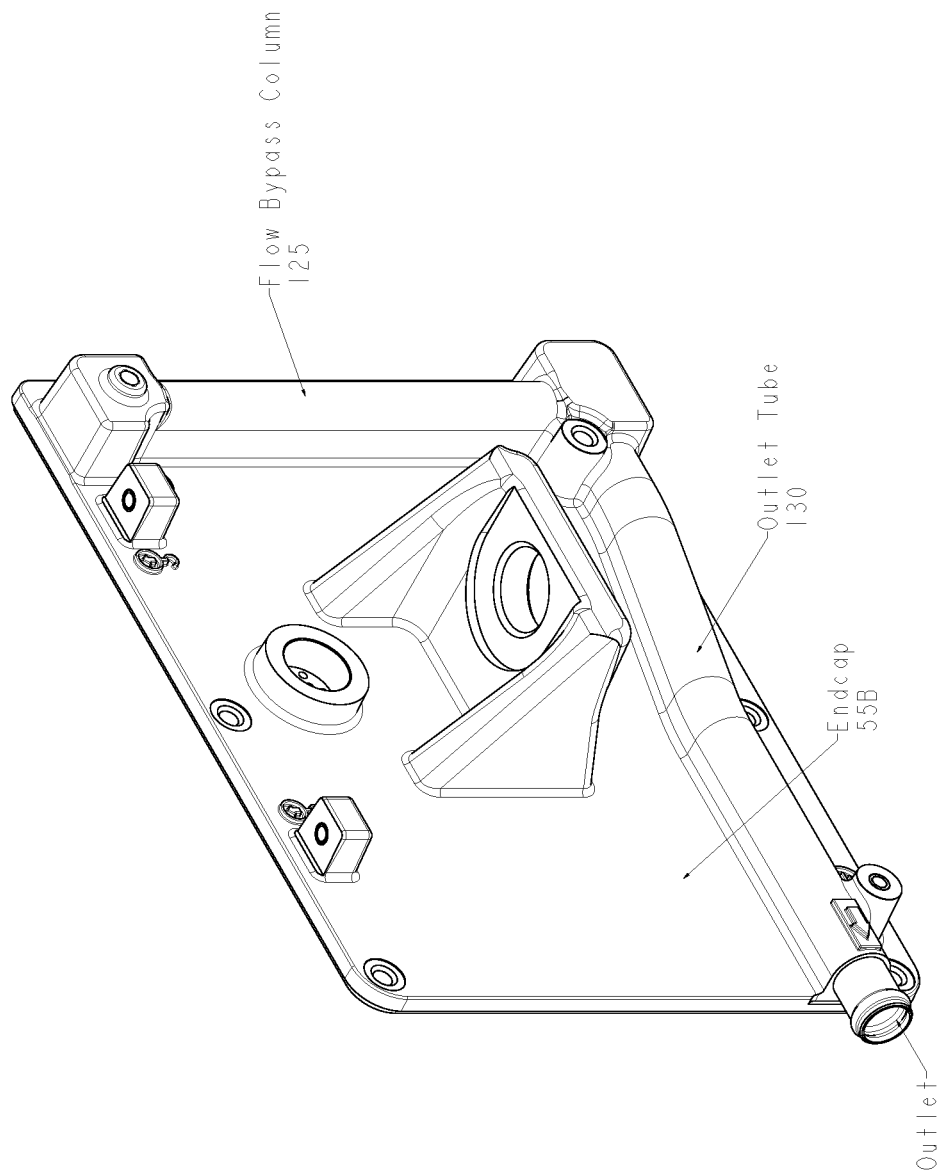
FIG. 8 illustrates a perspective view of an endcap having an outlet for fluid for a cooling system in accordance with aspects of the disclosure.

FIG. 8 illustrates an example of endcap 55B in accordance with aspects of the disclosure. The endcap 55 comprises a plate. The plates of both endcaps may be thermally conductive. For example, the plates may be made of aluminum.

An outlet tube 130 may be mounted on one side of the endcap 55B (external side). The outlet tube 130 may extend substantially parallel to the plate of the endcap 55B. An open end of the outlet tube 130 may have outlet 30. The outlet 30 may be connected to tubes, pipes (such as 1215B) for outputting of fluid to a cooling fluid reservoir 1205. The outlet tube 130 may extend from a rear of the endcap 55B to a front of the endcap 55B. The outlet may be curved to connected with a common manifold outlet (not shown in the figures) at an end of a common manifold such as the lower common manifold 10. However, the outlet tube 130 is not limited to being connected to the lower common manifold 10 and in other aspects of the disclosure, the outlet tube 130 may be connected to the upper common manifold 5. The inlet tube 26 and the outlet tube 130 may be connected to the same or different common manifold.

In some aspects of the disclosure, the endcap 55B may have a flow bypass column 125. The flow bypass column 125 may be included for a BEV application such as shown in FIG. 1. However, the flow bypass column 125 is not necessary in all BEV applications. In some aspects of the disclosure, the flow bypass column 125 may be included when a DC filter module and/or a DC interface module is included in the MPCS. The flow bypass column 125 fluidly connects the upper common manifold 5 and the lower common manifold 10.

The flow bypass column 125 may control a flow rate/volume of fluid into the DC interface module flow path 24C and the DC filter module flow path 24D. In an aspect of the disclosure, the flow bypass column 125 may be omitted in certain configurations such as a HEV. Each endcap 55A, 55B may also comprise a bleed valve port 180. The bleed valve port 180 may have a controllable opening such that trapped air within the fluid may be expunged from the fluid via the bleed valve port(s) 180.

As described above, in the example illustrated in FIG. 1, orifice plates 40 may be installed in the MPCS. For example, an orifice plate 40A may be installed in endcap 55B between the endcap 55B and the DC filter module 20D. In other aspects of the disclosure, the orifice plate 40A may be installed in the DC filter module chassis 20D between the DC filter module and the endcap 55B. This orifice plate 40A may control the flow rate/volume of the fluid into the module specific flow paths such as the DC interface module flow path 24C and the DC filter module flow path 24D and the flow bypass flow path 127 (flow bypass column 125). The larger the flow control opening 42, the larger the flow rate/volume is into the flow bypass flow path 127.

Each chassis 20 has one or more chassis connection openings 18. The chassis connection openings 18 are configured for mounting hardware to mount the chassis 20 together. In some aspects of the disclosure, a connection rod(s) (not shown in the figures) may be used to mount the aligned chassis (together).

Figure 9:
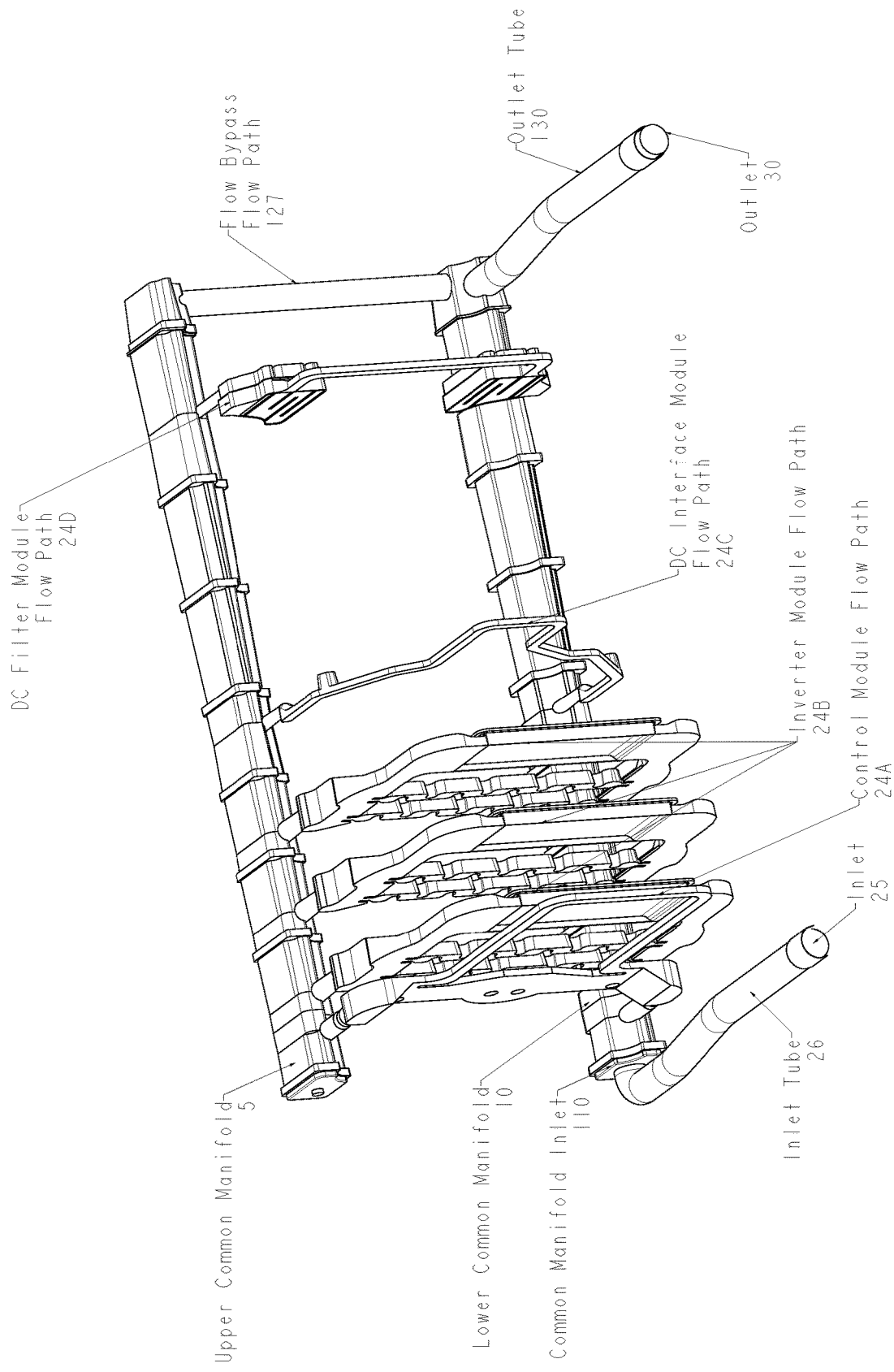
FIG. 9 illustrates an example of module specific flow paths connected between the common manifolds in accordance with aspects of the disclosure.

When the chassis 20 are mounted together, internal flow paths are formed and have a controllable flow rate, an example of the internal flow paths are illustrated in FIG. 9 (which corresponds to the configuration illustrated in FIG. 1). The segments 15 of the upper common manifold 5 form a contiguous fluid channel; the segments 15 of the lower common manifold 10 for a contiguous fluid channel and certain modules have module specific flow paths 24 such as the control module flow path 24A (for the control module), the inverter module flow paths 24B (for the inverter module), DC interface module flow path 24C (for an DC interface module) and a DC filter module flow path 24D (for the DC filter module). In some aspects of the disclosure, the junction module may not have a module specific flow path.

Each type of module (control, inverter, DC interface, filter) may have its own modular specific flow path. This is because each type of module may have different heat generating electronic components. The heating generating components may comprise semiconductor switches, capacitors, contactors, inductors, busbars, etc. . . . For example, an inverter module may have DC busbars, AC busbars, capacitors on the DC busbars, a DC backplane, gate drive circuitry including inductors, transformers, etc. Each of the components may have thermal cooling needs.

In an aspect of the disclosure, each inverter module may have the same module specific flow path, e.g., inverter module flow path 24B. The module specific flow path may be defined by a combination of a base of the chassis for the module and its corresponding coldplate cover. The module specific flow path includes recesses, grooves or opening on the base of the chassis for the module. These recesses, grooves or openings may be covered by a corresponding coldplate cover.

In an aspect of the disclosure, the flow rate/volume within the module specific flow path 24 may vary within a module (such as by having different branches of the flow path or sub-paths) depending on the components within the module.

Figure 10A:
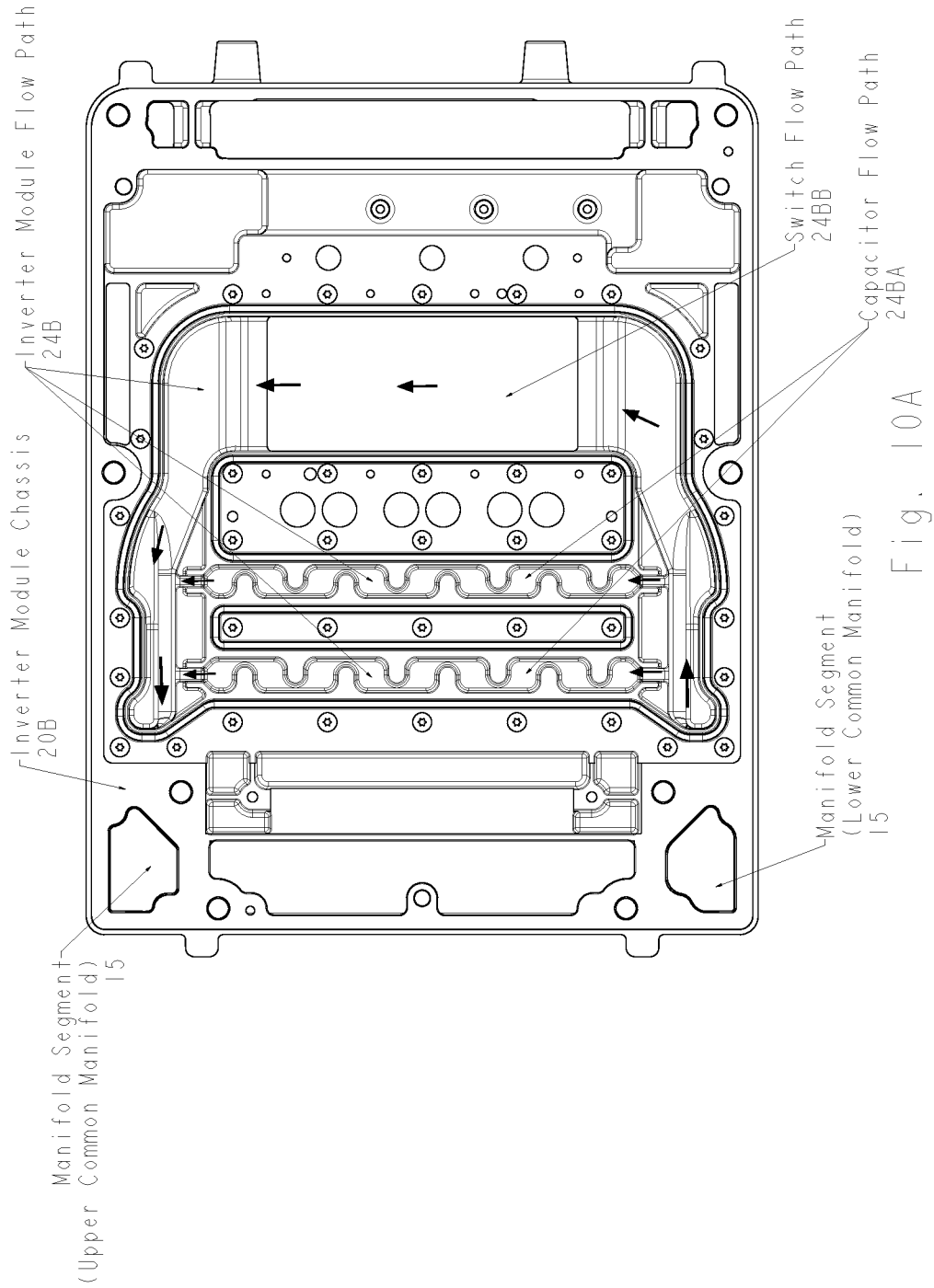
FIG. 10A illustrates a view of an example of an inverter module chassis in accordance with aspects of the disclosure.
Figure 10C:
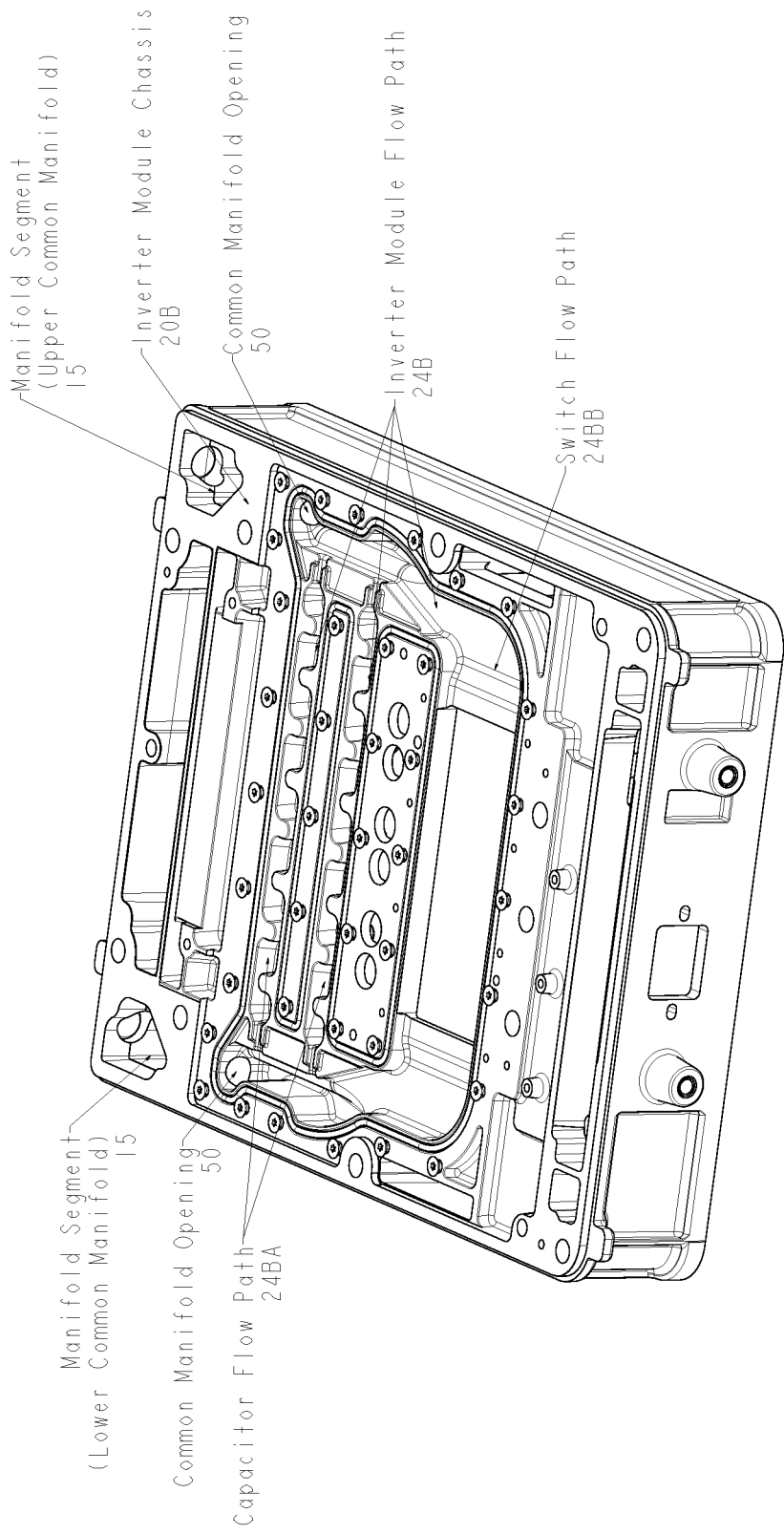
FIG. 10C illustrates a perspective view of the example of an inverter module chassis shown in FIG. 10A.

FIGS. 10A-10C illustrate an example of a module specific flow path for an inverter module in accordance with aspects of the disclosure (inverter module flow path 24B) (also shown in FIG. 9). A module specific flow path 24 is a path between respective common manifold openings 50 in the manifold segment 15 for the module. One of the common manifold openings 50 acts as the inlet for the module specific flow path and the other acts as the outlet for the module specific flow path. As shown in the example in FIG. 10A, the fluid flows from the lower common manifold 10 to the upper common manifold 5 in the example module. The flow is represented by arrows in FIG. 10A. The size of the arrows represents the flow rate. Specifically, the fluid flows from the common manifold opening 50 in the lower common manifold 10 (inverter manifold segment) to the common manifold opening 50 in the upper common manifold 5 (inverter manifold segment). Within the inverter module (chassis 20B), the fluid has two branches or sub-paths: a capacitor flow path 24BA and a switch flow path 24BB.

In accordance with aspects of the disclosure, the inverter module may have a plurality of capacitors on a DC busbar. The capacitors may be arranged in rows. The capacitor flow path 24BA may be aligned with the rows of capacitors. In an aspect of the disclosure, the capacitor flow path 24BA may meander to provide a larger path length where the fluid is aligned with the capacitors (and DC busbar) such as shown in FIGS. 10A/10C. The meander also impacts the flow rate as the diameter of the branch varies and varies the flow rate. FIGS. 10A/10C illustrate two fluid path rows for the capacitor flow path 24BA. The depth of each flow path row for the capacitor flow path 24BA is illustrated in FIG. 10C.

In accordance with aspects of the disclosure, the inverter module may have a semiconductor switching package comprising semiconductor switches. The semiconductor switches may be transistors such as Insulated-gate bipolar transistors (IGBT) or field effect transistors (FETS). For example, the FETs may be wide bandgap semiconductor such as, but not limited to, silicon carbide (SiC) or gallium nitride (GaN). The semiconductor switching package may have a pin field. The switch flow path 24BB may be aligned with the pin field. In some aspects of the disclosure, the switch flow path 24BB may have fins to increase the surface area for heat transfer.

FIG. 10B illustrates an example of an inverter coldplate cover 22B for the inverter module in accordance with aspects of the disclosure. The inverter coldplate cover 22B may be used to define different depths within the inverter module flow path 24B. The different depths may be used to control the flow rate/volume for specific portions of the path such as the branches (in conjunction with a depth of the recess, groove or opening in the base of the chassis) In some aspects of the disclosure, the inverter coldplate cover 22B may comprise one or more raised portions 150. The raise portions 150 restrict the flow of the fluid, which increases the flow rate and cooling capability. For example, the inverter coldplate cover 22B illustrated in FIG. 10B has a raised portion 150, which corresponds to the switch flow path 24BB (shown in FIGS. 10A/10C), when mounted to the inverter chassis 20B. The space between the pin field of the semiconductor switching package and the raised portion 150 is reduced based on the raising which increases the flow rate around the pin field. The input side with respect to the pin field may have a gradual rise allowing fluid to fill within the area to flow across the pin field toward the output side.

In an aspect of the disclosure, each chassis 20 is made of a thermal conductive material. For example, the chassis 20 may be made of aluminum. Since the chassis is thermally conductive, electronic components not aligned with a module specific flow path 24 may be cooled based on the thermal conduction between the fluid and the chassis. For example, other electronic components within the inverter module such as a printed circuit board having a transformer may be cooled via the inverter module flow path 24B associated with the inverter module chassis 20B and inverter coldplate cover 22B via the conductivity of the chassis 20B.

The DC filter module may have a different module specific flow path 24D v. 24B. FIGS. 11A-11D illustrate an example of a module specific flow path for an DC filter module in accordance with aspects of the disclosure (DC filter module flow path 24D) (also shown in FIG. 9) (with the filter module coldplate cover 22D). The DC filter module flow path 24D is a path between respective common manifold openings 50 in the manifold segment 15 for the DC filter module. One of the common manifold openings 50 acts as the inlet for the DC filter module flow path 24D and the other acts as the outlet for the DC filter module flow path 24D. As shown in the example in FIG. 11A, the fluid flows from the upper common manifold 5 to the low common manifold 10 in the example DC filter module. The flow is represented by arrows in FIG. 11A (shown for the upper serpentine path 24DA and the connection portion 24DB, but not the lower serpentine path). The size of the arrows represents the relative flow rate. Specifically, the fluid flows from the common manifold opening 50 in the upper common manifold (DC filter manifold segment) to the common manifold opening 50 in the lower common manifold 10 (DC filter manifold segment).

Within the DC filter module, the fluid has multiple different branches or sub-paths including an upper serpentine path 24DA, a lower serpentine path 24DC and a connection portion 24DB connecting the respective serpentine shaped paths (upper serpentine path 24DA and lower serpentine path 24DC).

Figure 11A:
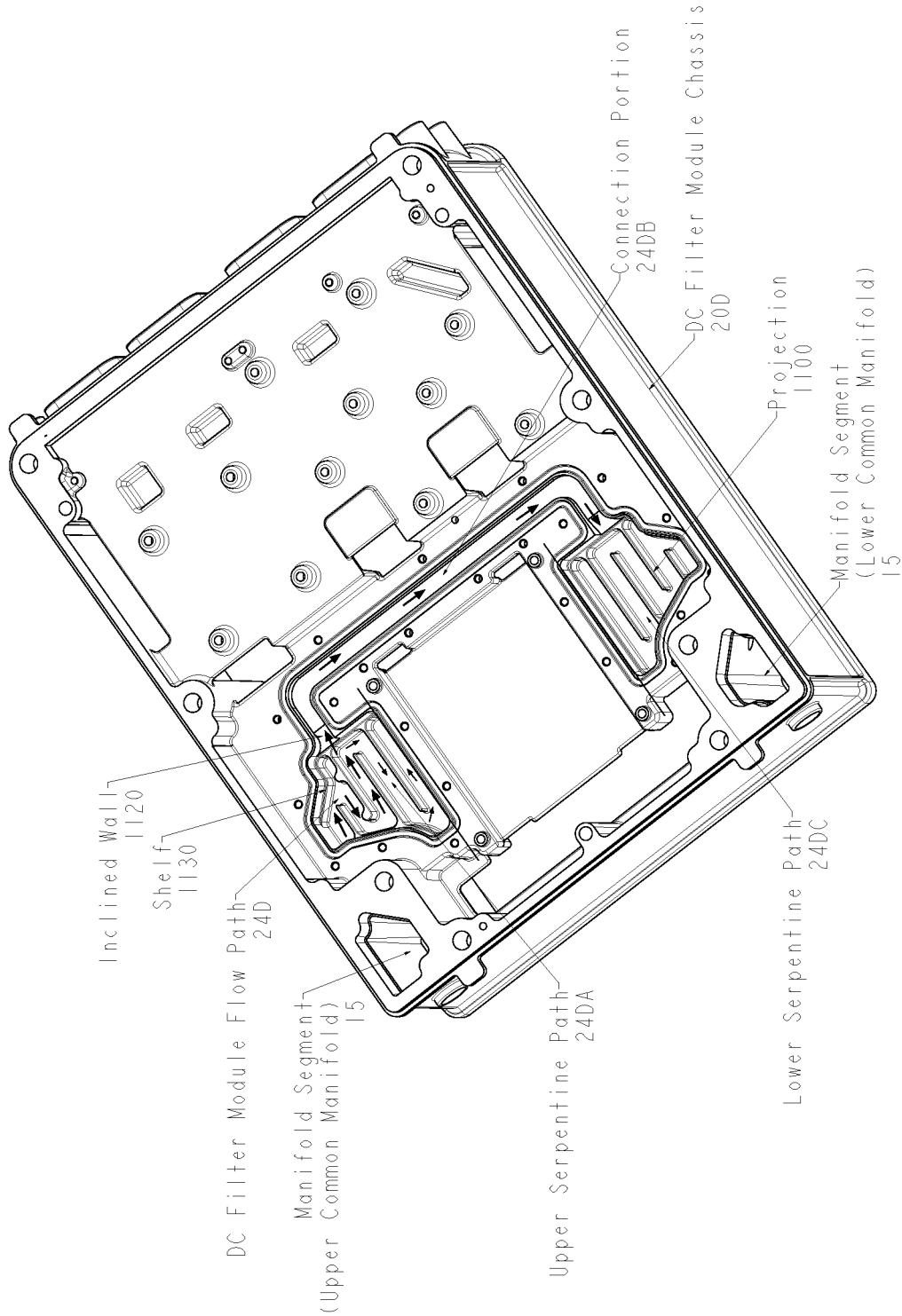
FIG. 11A illustrates a perspective view of an example of an DC filter module chassis in accordance with aspects of the disclosure.

As illustrated in FIG. 11A, each serpentine shaped paths 24DA/24DC has a portion formed from recesses in the DC filter module chassis 20. The recesses have projections 1100. The projections 1100 extend from a respective wall of the recess (front or back wall). The projections 1100 may be parallel to each other and extend in a front-rear direction. Each serpentine path 24DA/24DC has two levels of passages. The passages are separated by a flow separating plate 1115, which is illustrated in FIG. 11D. The flow separating plate 1115 has a shape corresponding to the shape of the recess. The recess has a shelf or slot 1130 for mounting the flow separating plate 1115. The recess also has a cutout for the sealing elastomer (not labeled). When mounted, the projections 1100 contact a surface of the flow separating plate 1115. The first level passage is defined by the spaces between the projections 1100, a surface of the flow separating plate 1115 and a surface of the recess.

Figure 11C:
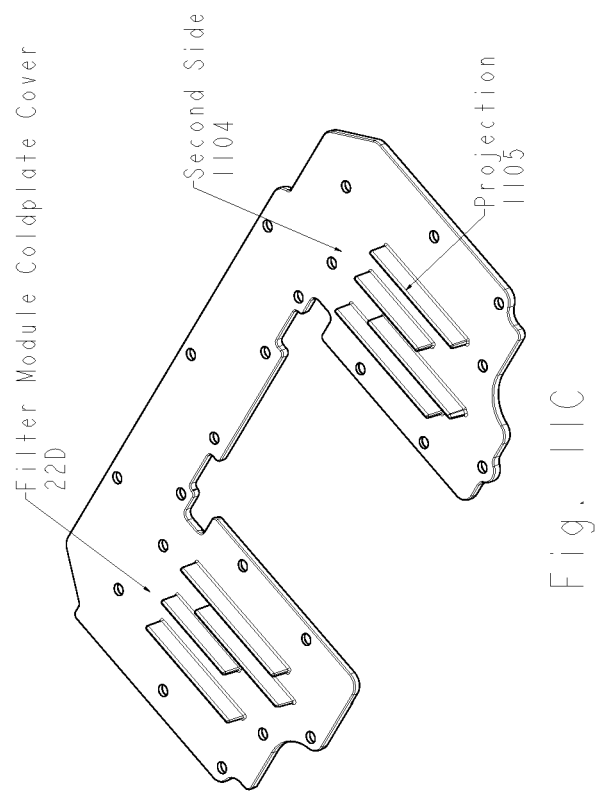
FIGS. 11B and 11C illustrate views of an example of a coldplate cover for the DC filter module in accordance with aspects of the disclosure.
Figure 11B:
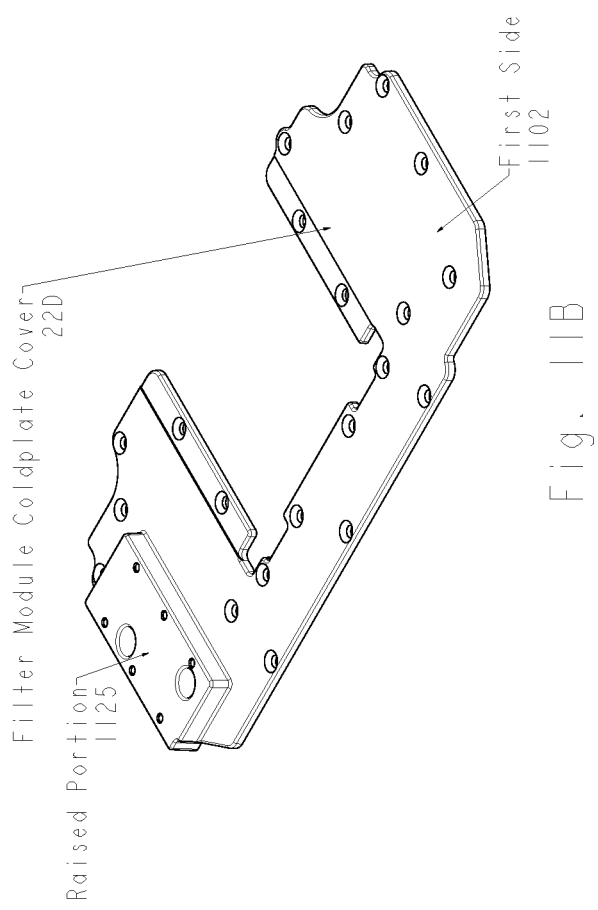
Figure 11D:
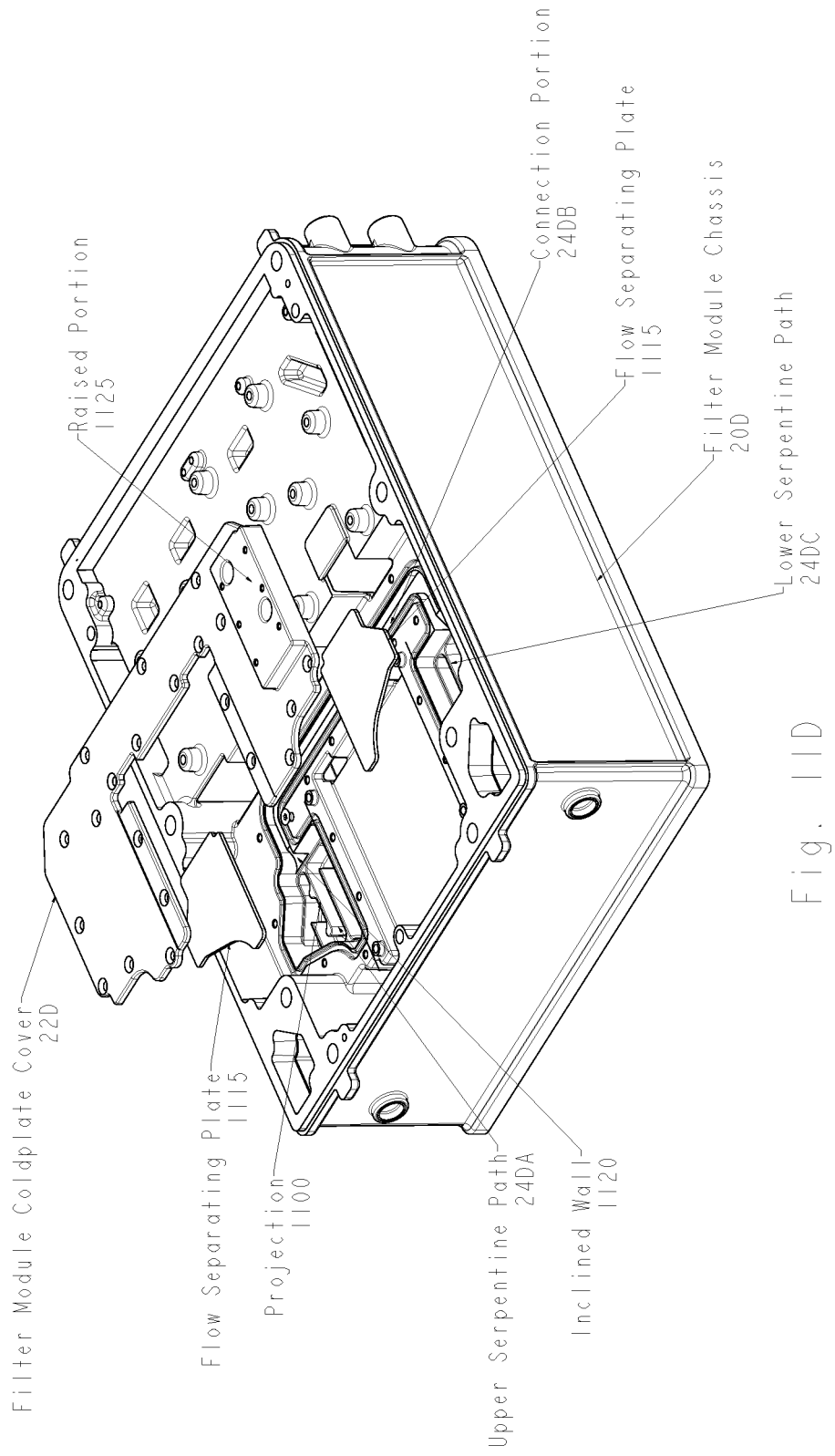
FIG. 11D illustrates an exploded perspective view of an example of an DC filter module chassis of FIG. 11A showing the coldplate cover and flow separating plate in accordance with aspects of the disclosure.

FIGS. 11B and 11C illustrate different views of the filter module coldplate cover 22D. FIG. 11B illustrates a first side 1102 of the filter module coldplate cover 22D. FIG. 11C illustrates a second side 1104 of the filter module coldplate cover 22D. As illustrated in FIG. 11C, the second side 1104 of the filter module coldplate cover 22D has projections 1105. When the filter module coldplate cover 22D is mounted to the DC filter module chassis 20D, the projections 1105 contact another surface of the flow separating plate 1115. The second level passage is defined by the spaces between the projections 1105, a second side 1104 of the filter module coldplate cover 22D and a surface of the flow separating plate 1115.

The flow path 24D also has an inclined wall 1120. The inclined wall 1120 connects a respective serpentine path 24DA or 24DC to the connection portion 24DB. The inclined wall 1120 is at an angle relative to the connection portion 24DB and the recess.

Fluid entering the DC filter module flow path 24D travels from the opening 50 (inlet) into the first level passage of the upper serpentine path 24DA, traverses the first level passage upper serpentine path 24DA. When the volume within the passage is large enough, the fluid reaches the inclined wall 1120. The fluid then branches into two directions. One direction, the fluid enters the second level passage between the flow separating plate 1115 and the second side 1104 of the filter module coldplate cover 22D. The fluid also enters the connection portion 24DB.

Certain fluid traverses the second level passage of the upper serpentine path 24DA and rejoins the fluid in the connection portion 24DB.

Fluid traverses the connection portion 24DB of the DC filter module flow path 24D and then into the other inclined wall 1120 enter the lower serpentine path 24DC. Once the fluid reaches the inclined wall 1120, the fluid may again divide and flow into two different passages, the first level passage and the second level passage of the lower serpentine path 24DC. The fluid in the first level passage of the lower serpentine path 24DC traverse the path and out to the outlet of the DC filter module flow path 24D (opening 50 in the manifold segment for the lower common manifold 10). The fluid in the second level passage of the lower serpentine path 24DC traverses the second level passage and returns to the first level passage.

The DC filter module comprises a plurality of electronic components that may require cooling, such as filter inverters, a three-wire choke, PCB including high-power resistors, fuses, busbars and contactors. Certain of these electronic components are mounted in alignment with the fluid path (e.g., direct fluid pathway). These components may be the filter inverters and three-wire choke. In some aspects of the disclosure, components may be directly mounted to the first side 1102 of the filter module coldplate cover 22D. For example, the first side 1102 of the coldplate cover 22D may have a rectangular shaped raised portion 1125. Certain resistors may be mounted to the raised portion 1125. These resistors may be included a common mode and differential mode filter.

In an aspect of the disclosure, common mode and differential mode filter inductors may be mounted to the first side 1102 of the filter module coldplate cover 22D (in the direct fluid pathway but offset from the raised portion 1125).

Other components such as the contactors, fuses and busbars may be indirectly cooled via the thermal conduction of the DC filter module chassis 20D (from the fluid) to any offset electronic components (not aligned).

The control module may also have its own control module flow path 24A. The control module flow path 24A may be formed from recesses in the control module chassis 20A and its corresponding coldplate cover. An example of the control module flow path 24A is illustrated in FIG. 9. A portion of the coldplate cover for the control module is illustrated in FIG. 1 (not labeled) (between the base of the control module chassis 20A and the base of an inverter module chassis 20B. In an aspect of the disclosure, the chassis 20A of the control module is mounted reverse of the other module chassis (base end to base end) as opposed to base end to open end for the other modules.

The control module flow path 24A may be a substantially rectangular loop between the module inlet and outlet. In an aspect of the disclosure, the module inlet is the opening 50 in the manifold segment for the lower common manifold and the module outlet is the opening 50 in the manifold segment for the upper common manifold. One of the sides of the loop may be wider.

In an aspect of the disclosure, the control module may comprise circuit card assemblies with control circuitry. Portions of the circuit card assemblies may not be aligned with the control module flow path 24A. However, once again, since the control module chassis 20A is made of a thermally conductive material, this portion may be cooled via the thermal conduction by the chassis 20A from the fluid path to the components.

The DC interface module may also have its own DC interface module flow path 24C. The DC interface module flow path 24C may be formed from recesses in the De interface module chassis 20C and its corresponding coldplate cover. An example of the DC interface module flow path 24C is illustrated in FIG. 9. The DC interface module flow path 24C may have a curved shape between the module inlet and outlet. For example, the DC interface module flow path 24C may have a symmetric stair-step shape. In an aspect of the disclosure, the module inlet is the opening 50 in the manifold segment for the upper common manifold and the module outlet is the opening 50 in the manifold segment for the lower common manifold.

The DC interface module may comprise multiple contactors, busbars and fuses. The DC interface module may also comprise a DC interface card, a power supply card and capacitors. The DC interface card is configured to drive contactors, for high voltage monitoring and high voltage interlock. In some aspects of the disclosure, certain DC busbars and the DC interface card may be aligned with the DC interface module flow path 24C (but not directly mounted to the base of the DC interface module chassis 20C) on one side of the base. There may be a plate that is mounted to the DC interface module chassis 20C which thermal transfers the heat from the DC bus to the fluid in the DC interface module flow path 24C. Other DC busbars, contactors, capacitors, current sensors and fuses may be offset from the DC interface module flow path 24C. These components may be cooled via heat transfer to the chassis 20C (indirect cooling) since the DC interface module chassis 20C is thermally conductive. The power supply card may be mounted on another side of the base and within the flow path.

FIG. 12 illustrates a block diagram of a cooling system 1200 in accordance with aspects of the disclosure. The cooling system 1200 comprises the internal manifolds/flow paths described above such as the upper common manifold 5, the lower common manifold 10 and module specific flow paths 24A-D. The cooling system 1200 also comprises external manifolds 1215A, 1215B. One external manifold 1215A is connected to the inlet tube 26 (via inlet 25). The other external manifold 1215B is connected to the outlet tube 130 (via outlet 30). The cooling system 1200 also comprises a cooling fluid reservoir 1205. The cooling fluid reservoir 1205 stores the cooling fluid for the system 1200. The cooling system 1200 also comprises an electric pump 1210 and pump controller 1220. The electric pump 1210, under the control of the pump controller 1220, pumps the fluid stored in the cooling fluid reservoir 1205 into the external manifold 1215A for transfer to the internal manifolds/flow paths 5, 10, 24A-24D (via the inlet 25). Once the fluid is pump through the internal manifolds/flow paths 5, 10, 24A-24D), the fluid returns to the cooling fluid reservoir 1205 via the external manifold 1215B.

Each external manifold 1215A, 1215B may be a hose or a tube.

The external manifold 1215B may comprise one or more heat exchangers to remove the heat from the fluid. In other aspects, the hear exchangers may be external to the external manifold 1215B. The heat exchanger may have an air-cooling system.

FIG. 12 illustrates one pump 1210 and controller 1220; however, multiple pumps 1210 and/or controllers 1220 may be used to circulate the fluid within the system 1200. For example, one pump 1210 may be on the inlet side and another on the outlet side. In an aspect of the disclosure, one controller 1220 may control both electric pumps 1210. However, for redundancy, multiple controllers 1220 may be used. In an aspect of the disclosure, the reservoir 1205 may have a fluid sensor disposed at a certain volume to measure the amount of fluid within the system 1200. The sensor may issue an alert when the fluid is below the sensor level to indicate that the fluid needs to be replaced (re-filled).

In an aspect of the disclosure, the fluid may be any suitable combination of water and another liquid. The liquid may be a commercially available refrigerant. In some aspects of the disclosure, the fluid may be a water-ethylene-glycol mixture or solution. For example, there may be a 50/50% concentration between the water and the ethylene-glycol. Different fluids may be used for different configurations of the MPCS. In other aspects of the disclosure, a mixture or solution of water-propylene glycol may be used.

In an aspect of the disclosure, the controller 1220 may control the electric pump 1210 to provide a preset total flow rate into the internal manifolds/flow paths 5, 10, 24A-24B. The preset total flow rate may be based on the configuration of the MPCS including BEV v. HEV, number of modules and types of modules. For example, for a BEV configuration, such as the example illustrated in FIGS. 1 (and 9), the total flow rate may be about 40 Liters-per-minute (LPM) to about 54 LPM.

In an aspect of the disclosure, when the total flow rate is 40 LPM, the fluid enters the inlet 25 at 40 LPM, flows into the inlet tube 26 and the common manifold inlet 110 at the same rate. Given the positions of the blocking plate 35 and orifice plates 40A, 40B (as illustrated in the example of FIG. 1), the fluid will start to flow in the lower common manifold 10 (segments 15) for the control module and the three inverter modules. Once it reaches the blocking plate 35 between the inverter module and the DC interface module, the fluid will flow into the module specific flow paths (control module flow path 24A and inverter module flow paths 24B). Since the flow paths 24B are similar, the flow rate for the three inverter modules may be the same. For a total flow rate of about 40 LPM, the flow rate within each inverter module flow path 24B may be about 8.5 LPM. Although, since there are subpaths (branches), the flow rate within the branches may be lower. The control module flow path 24A may have a flow rate of about 14 LPM. These values are also in part due to the position of the orifice plate 40B between the control module and the inverter module and size of the flow control opening 42. For example, the flow control opening 42 may be about 3.5 mm. The flow rate into the opening 42 may be less than 1 LPM (such as about 0.5 LPM). Since the blocking plate 35 is located between the inverter module and the DC interface module in the example of FIG. 1, the fluid cannot travel into the DC interface module via the lower common manifold 10. The fluid enters the DC interface module via the upper common manifold 5. The fluid also enters the DC filter module via the upper common manifold 5. The module flow rate is determined by the total fluid rate (40 LPM in this example) and the location of the orifice plates 40A, 40B and the size of the fluid control openings 42 and the flow bypass column 125 (path 127). In this example (as configured) about 2 LPM may enter both the DC interface module flow path 24C and the DC filter module 24D (the DC filter module 24D may have less than the DC interface module). Most of the flow is redirected into the bypass column 125 (bypass flow path 127) (about 36 LPM).

Figure 14:
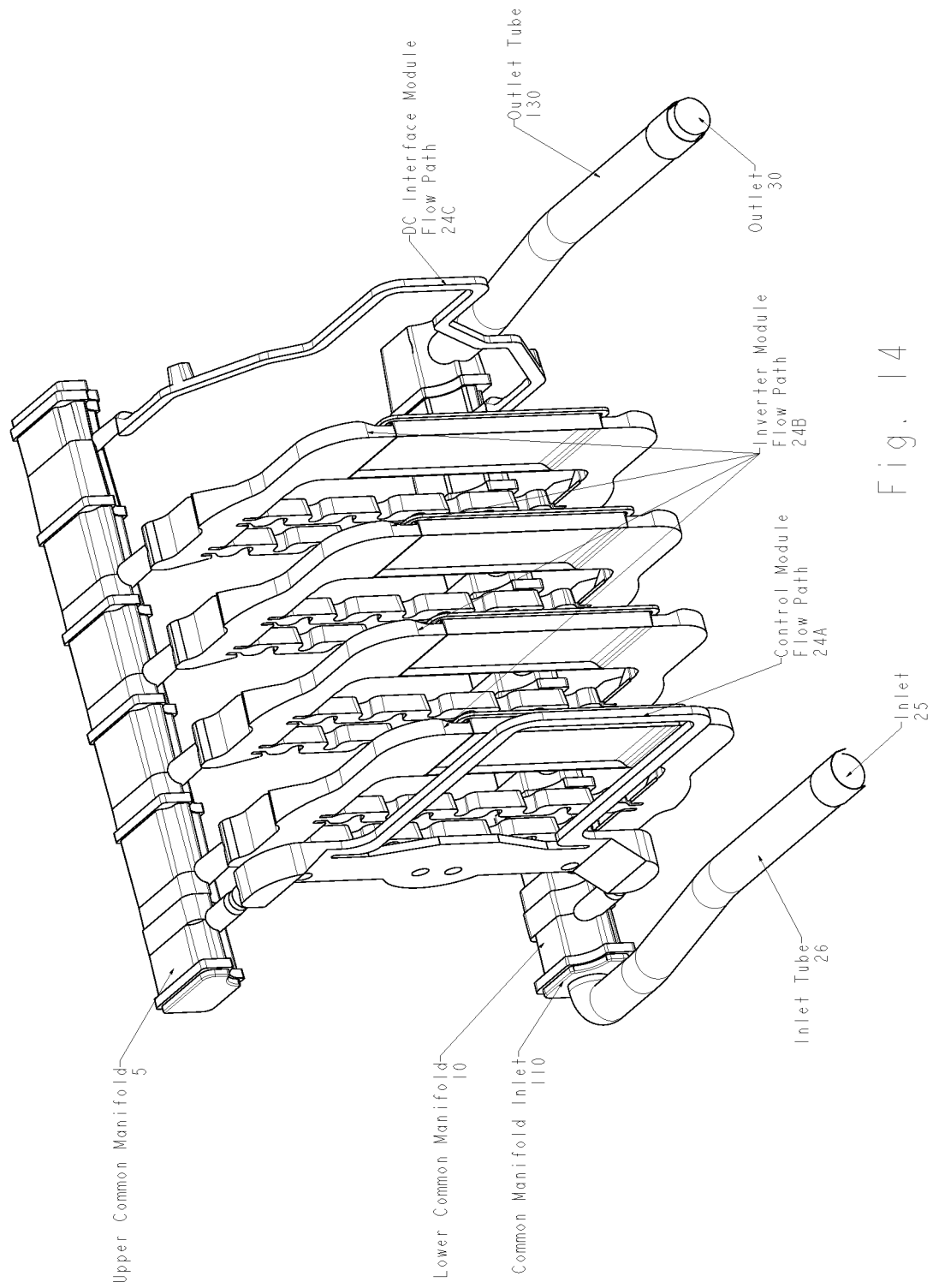
FIG. 14 illustrates another example of module specific flow paths connected between the common manifolds in accordance with aspects of the disclosure.

FIGS. 1 and 9 illustrate one example configuration for the MPCS such as for a BEV. FIGS. 13 and 14 illustrate another example configuration for the MPCS such as for a HEV. The number of modules and the type may vary between the different configurations.

FIG. 13 illustrates an exploded view of an example of a MPCS (without the power electronics and control components depicted) similar to FIG. 1. FIG. 13 illustrates an example configuration for a HEV where FIG. 1 illustrates an example configuration for a BEV. Many of the components are similar and will not be described again in detail. In the example illustrated in FIG. 13, the filter module and the junction module(s) are omitted. The MPCS illustrated in FIG. 13 comprises a control module, a plurality of inverter modules (both three-phase out and single-phase out) and a DC interface module.

The example configuration illustrated in FIG. 13 have two different types of inverter modules. For example, the example configuration has both a three-phase out inverter module and multiple single-phase out inverter modules, e.g., three different single-phase out inverter modules. The three single-phase out inverter modules may be connected to the same electric machine. The three-phase out inverter module may be connected to a different electric machine.

In an aspect of the disclosure, the single three-phase out inverter may be positioned next to the control module. As illustrated in the example, the inverter module chassis 20BB is shown adjacent to the control module chassis 20A. The three single-phase out inverter modules may be connected next. In other aspects, the connection may be reversed and the three single-phase out inverter modules may be adjacent to the control module followed by the three-phase out module.

In an aspect of the disclosure, a blocking plate 35 may be inserted between the three-phase out inverter module and the first single-phase out inverter module as illustrated in FIG. 13. In other aspects, the blocking plate may be inserted between the last single-phase out inverter module and the three-phase out inverter module.

Since the filter module is omitted in the example configuration in FIG. 13, the bypass column 125 may be omitted from the endcap 55C.

As illustrated in FIG. 14, the single-phase out inverter module may have the same inverter module flow path 24B and the three-phase out inverter module. FIG. 14 (example configuration for an HEV) is a corresponding flow path view as FIG. 9 (example configuration for a BEV). In the example configuration illustrated in FIG. 14 v. FIG. 9, the orifice plates 40A, 40B are omitted. The location of the blocking plate 35 is different, e.g., between inverter types and opposed to between the last inverter and the DC interface module.

As described above, the modular specific flow rates may be different based on the configuration. Additionally, the position of the blocking plate(s) 35 and the orifice plate(s) 40 may be different.

In some aspects of the disclosure, a minimum total flow rate may be the same due to both example configuration having multiple inverter modules. However, since the orifice plates 40A, 40B are omitted and the blocking plate 35 is in a different relative location, the module specific flow rates may be different. In an aspect of the disclosure, the control module flow rate may be higher for the HEV configuration (e.g., FIGS. 13 and 14). This may be because there may be more components in the control module for the HEV configuration as there are two different types of inverter modules. For example, the flow rate for the control module in the example of the HEV configuration may be about 24 LPM v. about 14 LPM for the example illustrated in FIGS. 1 and 9.

The flow rate within the three-phase out inverter module (chassis 24BB) may be about 16 LPM (e.g., 40-24). Each single-phase out inverter module (chassis 24B) may have a flow rate about 12.5 LPM. The DC interface module may receive the balance, e.g., about 2.5 LPM.

In the example illustrated in FIGS. 13 and 14, the blocking plate 35 once again is on the lower common manifold 10 (in one of the segments 15). Once the fluid reaches the upper common manifold 5, the fluid can flow into the three single-phase out inverter modules and the DC interface module (paths 24B and 24C).

The cooling system 1200 and segmented common manifolds 5, 10 have been described herein in the context of an MPCS and vehicles. However, in other aspect of the disclosure, the segmented common manifolds 5, 10, blocking plates 35 and orifice plates 40 may be used in any cooling system where the system is used for a modular device, where each module has its own chassis. The modular device is not limited to being installed in a vehicle. For example, the modular device may be in a building such as an apartment building.

The coldplate covers may be attached to the corresponding module chassis using an elastomer seal, which may be placed on a seal cutout in a recess in the chassis. FIGS. 10B, 11B and 11C illustrate openings in the coldplate covers 22B and 22D. The openings are for mounting the respective coldplate covers 22B, 22D to the base of the corresponding module chassis 20B, 20D.

In the discussion and claims herein, the term "about" indicates that the value listed may be somewhat altered, as long as the alteration does not result in nonconformance of the process or device. For example, for some elements the term "about" can refer to a variation of +0.1%, for other elements, the term "about" can refer to a variation of ±1% or ±10%, or any point therein. For example, the term about when used for a measurement in mm, may include +/−0.1, 0.2, 0.3, etc., where the difference between the stated number may be larger when the state number is larger. For example, about 1.5 may include 1.2-1.8, where about 20, may include 18.0-22.0.

As used herein, the term "substantially", or "substantial", is equally applicable when used in a negative connotation to refer to the complete or near complete lack of an action, characteristic, property, state, structure, item, or result. For example, a surface that is "substantially" flat would either completely flat, or so nearly flat that the effect would be the same as if it were completely flat. "Substantially" when referring to a shape or size may account for manufacturing where a perfect shapes, such as circular or sizes may be difficult to manufacture.

As used herein terms such as "a", "an" and "the" are not intended to refer to only a singular entity, but include the general class of which a specific example may be used for illustration. As used herein, terms defined in the singular are intended to include those terms defined in the plural and vice versa.

References in the specification to "one aspect", "certain aspects", "some aspects" or "an aspect", indicate that the aspect(s) described may include a particular feature or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

For purposes of the description hereinafter, the terms "upper", "lower", "right", "left". "vertical", "horizontal", "top", "bottom", and derivatives thereof shall relate to a device relative to a floor and/or as it is oriented in the figures or with respect to a surface.

Reference herein to any numerical range expressly includes each numerical value (including fractional numbers and whole numbers) encompassed by that range. To illustrate, reference herein to a range of "at least 50" or "at least about 50" includes whole numbers of 50, 51, 52, 53, 54, 55, 56, 57, 58, 59, 60, etc., and fractional numbers 50.1, 50.2 50.3, 50.4, 50.5, 50.6, 50.7, 50.8, 50.9, etc. In a further illustration, reference herein to a range of "less than 50" or "less than about 50" includes whole numbers 49, 48, 47, 46, 45, 44, 43, 42, 41, 40, etc., and fractional numbers 49.9, 49.8, 49.7, 49.6, 49.5, 49.4, 49.3, 49.2, 49.1, 49.0, etc.

The terminology used herein is for the purpose of describing particular embodiments only and is not intended to be limiting the scope of the disclosure and is not intended to be exhaustive. Many modifications and variations will be apparent to those of ordinary skill in the art without departing from the scope and spirit of the disclosure.

What is claimed is:

1. A cooling system for a modular power control system (MPCS), the MPCS comprises a plurality of modules, each module having a chassis, the chassis comprising a first manifold segment and a second manifold segment, the cooling system comprising:

an inlet;
a first common manifold formed from the first manifold segment of each module, where when the plurality of modules is mounted to each other, each of the first manifold segments align to provide a fluid channel between endcaps;
a second common manifold formed from the second manifold segment of each module, where when the plurality of modules is mounted to each other, each of the second manifold segments align to provide a fluid channel between endcaps,
the chassis of at least two modules further has a first opening providing a fluid interface region between the first common manifold and a first module specific flow path, and a second opening providing a fluid interface region between a second module specific flow path and the second common manifold, where the first and second module specific flow paths provides at least one fluid branch between the first common manifold and the second common manifold; and
an outlet,
wherein the inlet is in fluid communication with an end of the first common manifold and the outlet is in fluid communication with the other end of the first common manifold or an end of the second common manifold,
wherein the inlet is connectable to a fluid source via a pump controlled to provide a set total fluid rate; and
wherein the endcaps include a first endcap and a second endcap, the first endcap comprises an inlet tube mounted on an external surface of the first endcap, the inlet tube have the inlet and a common manifold inlet on opposite ends of the inlet tube, where the common manifold inlet is aligned with the first common manifold, the second endcap comprises an outlet tube mounted on an external surface of the second endcap, the outlet tube having the outlet and a common manifold outlet on opposite ends of the outlet tube, the common manifold outlet is aligned with one of the first common manifold or the second common manifold, the outlet being connectable to the fluid source.

2. The cooling system of claim 1, wherein each of the first manifold segments and the second manifold segments have a shelf configured to receive a blocking plate or a orifice plate, where the blocking plate is configured to block fluid from flowing to a downstream manifold segment of in a common manifold which the blocking plate is mounted, and where the orifice plate comprises an opening, the orifice plate is configured to control flow rates of fluid within the first common manifold, the second common manifold and the first and second module specific flow paths.

3. The cooling system of claim 2, wherein the position of the blocking plate or of the orifice plate is based on a number of the plurality of modules.

4. The cooling system of claim 3, wherein the position of the blocking plate or of the orifice plate is based on types of the plurality of modules in the MPCS, wherein the type is selected from a control module, an inverter module, a DC interface module, a DC filter module, and a junction module.

5. The cooling system of claim 4, wherein the MPCS is installable in a battery electric vehicle (BEV) or a hybrid electric vehicle (HEV).

6. The cooling system of claim 5, wherein the MPCS is installed in the BEV and comprises the control module, three inverter modules, the DC interface module, at least one junction module and the DC filter module, and where the blocking plate is positioned between one of the inverter modules and the DC interface module.

7. The cooling system of claim 6, wherein the orifice plate is positioned between the control module and one of the inverter modules.

8. The cooling system of claim 6, wherein the second endcap further comprises a bypass column in fluid communication with the first common manifold and the second common manifold, and wherein the orifice plate is positioned between the DC filter module and the second endcap.

9. The cooling system of claim 7, wherein a size of the opening in the orifice plate determines ratios of flow between the first and second module specific flow paths for the DC filter module and the DC interface module, respectively and flow into the bypass column.

10. The cooling system of claim 2, wherein the opening in the orifice plate has a diameter between about 2 mm and about 20 mm.

11. The cooling system of claim 4, wherein the flow rate or rates within the first and second module specific flow paths is different for the different types of modules.

12. The cooling system of claim 4, wherein the first and second module specific flow paths is different for at least two different modules within the MPCS.

13. The cooling system of claim 4, wherein the first and second module specific flow paths for the inverter module comprises multiple branches, wherein the flow rates in different branches of the inverter module are different.

14. The cooling system of claim 1, wherein the fluid is water-ethylene-glycol.

15. The cooling system of claim 6, wherein the total flow rate into the inlet is between about 40 liters-per-minute (LPM) and about 54 LPM.

16. The cooling system of claim 5, wherein when the MPCS is installed in the HEV, the inverter module comprises a first type inverter module and a second type inverter module, wherein the flow rate within the first and second module specific flow paths for the first type inverter module is different than the flow rate within the module specific flow path for the second type inverter module.

17. The cooling system of claim 16, wherein there are three first type inverter modules and one second type inverter module and wherein a blocking plate is installed between one of the first type inverter module and the second type inverter module.

18. The cooling system of claim 1, wherein the chassis for each module is thermally conductive.

19. The cooling system of claim 7, wherein the second endcap has a shelf configured to receive an orifice plate, wherein the orifice plate is between the second endcap and the DC filter module.

* * * * *